US012735563B2

(12) United States Patent
Hu et al.

(10) Patent No.: US 12,735,563 B2
(45) Date of Patent: Sep. 15, 2026

(54) RESIN COMPOSITION AND PRODUCT THEREOF

(71) Applicant: ELITE ELECTRONIC MATERIAL (ZHONGSHAN) CO., LTD., Zhongshan City (CN)

(72) Inventors: Zhilong Hu, Zhongshan City (CN); Changyuan Li, Zhongshan City (CN); Xiang Xiong, Zhongshan City (CN); Hezong Zhang, Zhongshan City (CN)

(73) Assignee: ELITE ELECTRONIC MATERIAL (ZHONGSHAN) CO., LTD., Zhongshan City (CN)

( * ) Notice: Subject to any disclaimer, the term of this patent is extended or adjusted under 35 U.S.C. 154(b) by 487 days.

(21) Appl. No.: 18/391,239

(22) Filed: Dec. 20, 2023

(65) Prior Publication Data

US 2025/0136804 A1 May 1, 2025

(30) Foreign Application Priority Data

Oct. 30, 2023 (CN) ........................ 202311422049.1

(51) Int. Cl.

| | |
|---|---|
| ***C08L 43/04*** | (2006.01) |
| ***C08J 5/24*** | (2006.01) |
| *H05K 1/03* | (2006.01) |

(52) U.S. Cl.

CPC ............... *C08L 43/04* (2013.01); *C08J 5/244* (2021.05); *C08J 2343/04* (2013.01); *C08J 2409/06* (2013.01); *C08J 2423/16* (2013.01); *C08J 2453/02* (2013.01); *C08J 2465/00* (2013.01); *C08L 2205/025* (2013.01); *H05K 1/0366* (2013.01)

(58) Field of Classification Search

CPC combination set(s) only.

See application file for complete search history.

(56) References Cited

U.S. PATENT DOCUMENTS

2021/0108074 A1* 4/2021 Hu ....................... C08G 65/485

FOREIGN PATENT DOCUMENTS

| | | | | |
|---|---|---|---|---|
| CN | 104629341 A | * | 5/2015 | |
| CN | 112646463 A | * | 4/2021 | .............. C08J 5/249 |
| CN | 115565717 A | | 1/2023 | |
| JP | 2021176934 A | | 11/2021 | |

* cited by examiner

*Primary Examiner* — Peter A Salamon

(74) *Attorney, Agent, or Firm* — Maschoff Brennan

(57) ABSTRACT

A resin composition is disclosed, comprising 100 parts by weight of a copolymer of phenylvinylsilane and alkenyl compound and 20 parts by weight to 100 parts by weight of a vinylbenzyl-terminated phenolic resin; wherein the raw material of the copolymer of phenylvinylsilane and alkenyl compound comprises a phenylvinylsilane and an alkenyl compound, based on a total weight of the phenylvinylsilane and the alkenyl compound being 100 parts by weight, the phenylvinylsilane is 80 parts by weight to 98 parts by weight, and the alkenyl compound is 2 parts by weight to 20 parts by weight. The resin composition can be made into a product such as a prepreg, a resin film, a laminate, a printed circuit board or a cured insulator.

17 Claims, 2 Drawing Sheets

RESIN COMPOSITION AND PRODUCT THEREOF

CROSS-REFERENCE TO RELATED APPLICATIONS

This non-provisional application claims priority under 35 U.S.C. § 119(a) on Patent Application No. 202311422049.1 filed in China on Oct. 30, 2023, the entire contents of which are hereby incorporated by reference.

BACKGROUND

1. Technical Field

The present disclosure relates to the field of a resin composition, specifically, a resin composition for preparing a prepreg, a resin film, a laminate, a printed circuit board or a cured insulator, and a product thereof.

2. Related Art

Recently, with the rapid advancement of information processing of electronic products, such as mobile communication, servers, and cloud storage, directed toward high-frequency signal transmission and high-speed digitalization, low-dielectric resin materials have become the mainstream for the development of laminates for high speed data transmission. In the manufacture of copper-clad laminate materials, phenylvinylsilane as raw material is easily volatilized due to high temperature during the heating process. When the phenylvinylsilane is used directly, it causes not only the waste of expensive raw materials but also the change in properties of the copper-clad laminate materials, thereby failing to meet the performance requirement.

Therefore, how to optimize and improve resin materials to reduce volatility thereof and improve the overall performance of the copper-clad laminate materials, for example, improvements in one or more of glass transition temperature, copper foil peeling strength, ratio of thermal expansion, coefficient of thermal expansion, thermal resistance in pressure cooking test, dielectric constant and dissipation factor, is a problem that needs to be solved urgently in this field.

SUMMARY

In view of the problems in the prior arts, the present disclosure provides a resin composition applicable to manufacturing a prepreg, a resin film, a laminate, a printed circuit board or a cured insulator to solve the problems associated with high volatility of the resin product and failure to meet one or more of the above performance requirements.

In the first aspect, the present disclosure provides a resin composition, based on part by weight, comprising: 100 parts by weight of a copolymer of phenylvinylsilane and alkenyl compound and 20 parts by weight to 100 parts by weight of a vinylbenzyl-terminated phenolic resin;

- the copolymer of phenylvinylsilane and alkenyl compound comprises a structural unit formed of a phenylvinylsilane and an alkenyl compound; the raw material of the copolymer of phenylvinylsilane and alkenyl compound comprises the phenylvinylsilane and the alkenyl compound, based on a total weight of the phenylvinylsilane and the alkenyl compound being 100 parts by weight, the phenylvinylsilane is 80 parts by weight to 98 parts by weight, and the alkenyl compound is 2 parts by weight to 20 parts by weight.

The phenylvinylsilane has a structure represented by Formula (1) and/or Formula (2), the alkenyl compound has a structure represented by Formula (3), and the vinylbenzyl-terminated phenolic resin has a structure represented by Formula (4):

Formula (1)

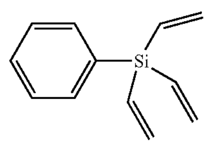

Formula (2)

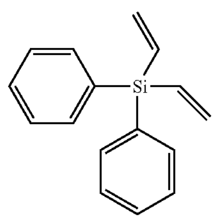

Formula (3)

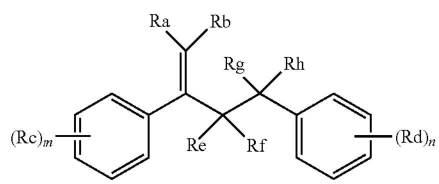

-continued

Formula (4)

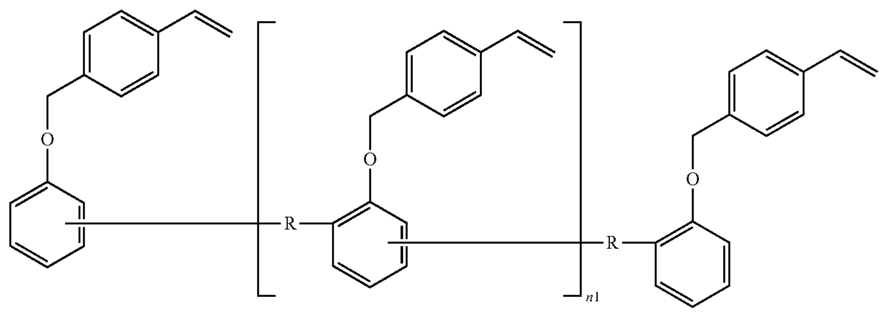

wherein each of Ra, Rb, Re and Rd is independently H or a monovalent organic group, each of m and n is independently an integer of 0 to 5, and each of Re, Rf, Rg and Rh is independently H or a monovalent alkyl group with 1 to 4 carbon atoms; and R is a divalent organic group, and n1 is an integer of 1 to 30.

In one exemplary embodiment, R is at least one of methylene, dicyclopentadienyl and substituted or unsubstituted arylene, and n1 is an integer of 1 to 10.

In one exemplary embodiment, the alkenyl compound has a structure represented by at least one of Formula (11), Formula (12) and Formula (13):

2,4-diphenyl-4-methyl-1-pentene:

Formula (11)

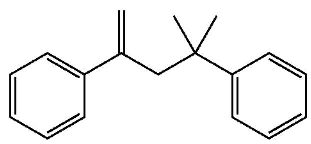

2,4-diphenyl-3,4-dimethyl-1-hexene:

Formula (12)

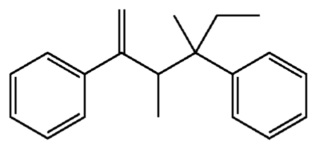

2,4-bis(p-methoxy)phenyl-4-methyl-1-pentene:

Formula (13)

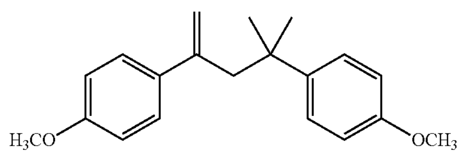

In the second aspect, the present disclosure provides a product, the product is made from the above resin composition, and the product comprises a prepreg, a resin film, a laminate, a printed circuit board or a cured insulator, but the present disclosure is not limited thereto.

In one exemplary embodiment, the resin composition or the product made therefrom provided by the present disclosure may have improvements in one or more of glass transition temperature, copper foil peeling strength, dielectric constant, dissipation factor, ratio of thermal expansion, coefficient of thermal expansion and thermal resistance in pressure cooking test.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
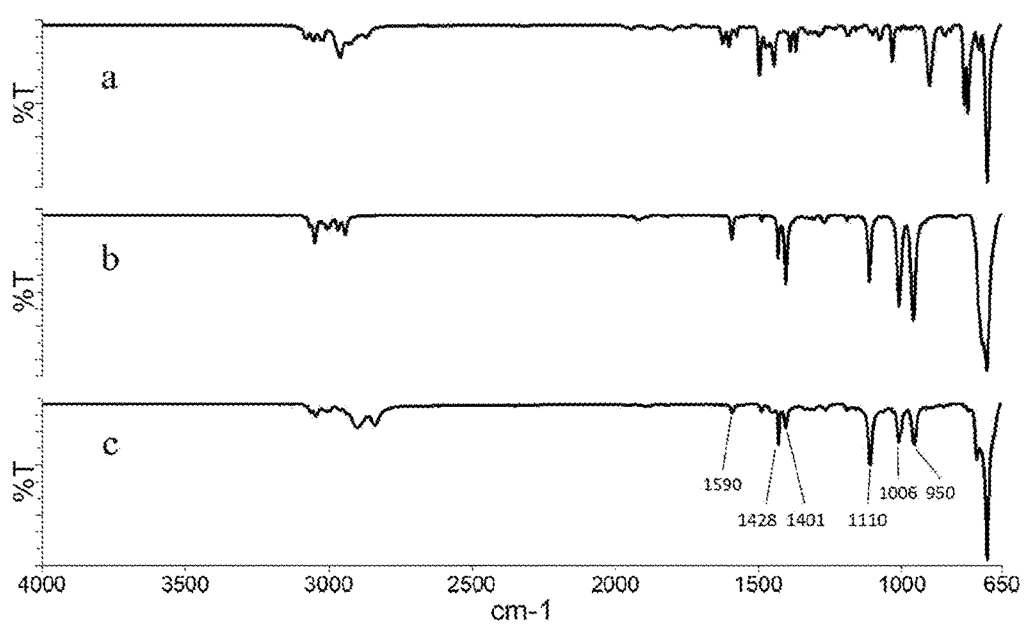
FIG. 1 is an IR spectrum of Copolymer 3 of the present disclosure, phenyltrivinylsilane and 2,4-diphenyl-4-methyl-1-pentene; wherein a is for 2,4-diphenyl-4-methyl-1-pentene, b is for phenyltrivinylsilane, and c is for Copolymer 3.

The exemplary embodiments disclosed herein are not intended to limit the scope of the present disclosure.

All technical and scientific terms used herein have the common meaning as understood by those skilled in the art. If otherwise specified, the terms defined herein shall prevail.

The terms "comprise," "include," "contain," "have," or the like belongs to open-ended transitional phrase (i.e., other elements not listed herein may be contained). The terms "consisting of," "composed by," "remainder being," or the like belongs to close-ended transitional phrases.

For the convenience of the description, numerical ranges used herein shall be understood as including all of the possible subranges and individual numerals or values therein (including fractions and integers).

The value used herein includes all of the values which will be the same as such value after being rounded off.

It should be understood that members in the Markush group can individually or combinely be used to describe the present disclosure.

The term "resin" used herein comprises monomer and its combination, polymer and its combination or a combination of monomer and its polymer, but not limited thereto. For instance, the term "maleimide resin" encompasses a maleimide monomer (a small molecule compound of maleimide), a maleimide polymer, a combination of maleimide monomers, a combination of maleimide polymers, and a combination of maleimide monomer(s) and maleimide polymer(s).

The symbol "*" in the structure of Formula means a bonding site.

A polymer herein refers to a product formed by monomer (s) via polymerization. A polymer may comprise a homopolymer, a copolymer, a prepolymer, etc., but not limited thereto.

A homopolymer refers to a chemical substance formed by a single compound via polymerization, addition polymerization or condensation polymerization. A copolymer refers to a chemical substance formed by two or more compounds via polymerization, addition polymerization or condensation polymerization and may comprise: random copolymers, such as a structure of -AABABBBAAABBA-; alternating copolymers, such as a structure of -ABABABAB-; graft copolymers, such as a structure of -AA(A-BBBB)AA(A-BBBB)AAA-; and block copolymers, such as a structure of -AAAAA-BBBBBB-AAAAA-. The copolymer in the present disclosure refers to the polymer formed by monomers of phenylvinylsilane, divinylbenzene and styrene via polymerization. The copolymer of the present disclosure only needs to have phenylvinylsilane, divinylbenzene and styrene segment, and whether the backbone and the side chain unit of the polymer are modified or not is not specified.

A prepolymer refers to a polymer with a lower molecular weight that between the monomer and the final product, and the prepolymer contains reactive functional groups to undergo further polymerization to form a completely cross-linked or cured product with a higher molecular weight.

The term "polymer" includes an oligomer, but the present disclosure is not limited thereto. An oligomer refers to a polymer with 2-20, typically 2-5, repeating units.

A modification herein comprises a product derived from a resin with its reactive functional group modified, a product derived from a prepolymerization reaction of a resin and other resins, a product derived from a crosslinking reaction of a resin and other resins, a product derived from homopolymerizing a resin, a product derived from copolymerizing a resin and other resins, etc. For instance, a modification may include replacing a hydroxyl group with a vinyl group via a chemical reaction, or obtaining a terminal hydroxyl group formed by a terminal vinyl group and a p-aminophenol via a chemical reaction.

An alkyl group, an alkenyl group and a hydrocarbyl group described herein encompasses various isomers thereof. For instance, a propyl group encompasses n-propyl and isopropyl.

The term "vinyl group-containing" herein encompasses functional groups with an ethylene carbon-carbon (C═C) bond or its derivatives in a compound structure. Thus, the example of "vinyl group-containing" may encompass containing a functional group, such as vinyl group, allyl group, vinyl benzyl group and methacrylate group, in a structure, but the present disclosure is not limited thereto. The location of the aforementioned functional group is not specified, for instance, the functional group may be located at the terminal of a long chain structure. Thus, for instance, a vinyl group-containing polyphenylene ether resin is a polyphenylene ether resin containing a functional group, such as vinyl group, allyl group, vinyl benzyl group and methacrylate group, but not limited thereto.

The unsaturated bond described herein refers to a reactive unsaturated bond, such as an unsaturated double bond with the potential of being crosslinked with other functional groups, such as an unsaturated carbon-carbon double bond with the potential of being crosslinked with other functional groups, but the present disclosure is not limited thereto.

Part(s) by weight represents weight part(s) in any weight unit, such as kilogram, gram, pound and so on, but the present disclosure is not limited thereto. For instance, 100 parts by weight of the vinyl group-containing polyphenylene ether resin may represent 100 kilograms of the vinyl group-containing polyphenylene ether resin or 100 pounds of the vinyl group-containing polyphenylene ether resin.

In the first aspect, the present disclosure provides a resin composition, based on part by weight, the resin composition includes: 100 parts by weight of a copolymer of phenylvinylsilane and alkenyl compound; and 20 parts by weight to 100 parts by weight of a vinylbenzyl-terminated phenolic resin.

In one exemplary embodiment, with respect to 100 parts by weight of the copolymer of phenylvinylsilane and alkenyl compound, the resin composition includes 20 parts by weight to 100 parts by weight of the vinylbenzyl-terminated phenolic resin. For instance, in one exemplary embodiment, with respect to 100 parts by weight of the copolymer of phenylvinylsilane and alkenyl compound, the vinylbenzyl-terminated phenolic resin is 25 parts by weight, 30 parts by weight, 35 parts by weight, 40 parts by weight, 45 parts by weight, 50 parts by weight, 55 parts by weight, 60 parts by weight, 65 parts by weight, 70 parts by weight, 75 parts by weight, 80 parts by weight, 85 parts by weight, 90 parts by weight or 95 parts by weight, and not limited thereto.

In one exemplary embodiment, the copolymer of phenylvinylsilane and alkenyl compound includes a structural unit formed of a phenylvinylsilane and an alkenyl compound. The raw material of the copolymer of phenylvinylsilane and alkenyl compound includes a phenylvinylsilane and an alkenyl compound, based on a total weight of the phenylvinylsilane and the alkenyl compound being 100 parts by weight, the phenylvinylsilane is 80 parts by weight to 98 parts by weight, and the alkenyl compound is 2 parts by weight to 20 parts by weight. For instance, in one exemplary embodiment, the phenylvinylsilane in parts by weight is such as 80 parts by weight, 85 parts by weight, 90 parts by weight, 95 parts by weight or 98 parts by weight, but the present disclosure is not limited thereto, and the alkenyl compound in parts by weight is such as 2 parts by weight, 5 parts by weight, 10 parts by weight, 15 parts by weight or 20 parts by weight, but the present disclosure is not limited thereto. For instance, the phenylvinylsilane and the alkenyl compound in parts by weight are respectively 80 parts by weight and 20 parts by weight. For instance, the phenylvinylsilane and the alkenyl compound in parts by weight are respectively 85 parts by weight and 15 parts by weight. For instance, the phenylvinylsilane and the alkenyl compound in parts by weight are respectively 90 parts by weight and 10 parts by weight. For instance, the phenylvinylsilane and the alkenyl compound in parts by weight are respectively 95 parts by weight, 5 parts by weight. For instance, the phenylvinylsilane and the alkenyl compound in parts by weight are respectively 98 parts by weight and 2 parts by weight.

In one exemplary embodiment, in the copolymer of phenylvinylsilane and alkenyl compound, the amount of the structural unit formed of the phenylvinylsilane is 78 mol % to 99 mol %, such as 78 mol %, 79 mol %, 80 mol %, 81 mol %, 82 mol %, 83 mol %, 84 mol %, 85 mol %, 86 mol %, 87 mol %, 88 mol %, 89 mol %, 90 mol %, 91 mol %, 92 mol %, 93 mol %, 94 mol %, 95 mol %, 96 mol %, 97 mol %, 98 mol % or 99 mol %, but the present disclosure is not limited thereto.

In one exemplary embodiment, in the copolymer of phenylvinylsilane and alkenyl compound, the amount of the structural unit formed of the alkenyl compound is 1 mol % to 20 mol %, such as 1 mol %, 2 mol %, 3 mol %, 4 mol %, 5 mol %, 6 mol %, 7 mol %, 8 mol %, 9 mol %, 10 mol %, 11 mol %, 12 mol %, 13 mol %, 14 mol %, 15 mol %, 16 mol %, 17 mol %, 18 mol %, 19 mol % or 20 mol %, but the present disclosure is not limited thereto.

In one exemplary embodiment, the copolymer of phenylvinylsilane and alkenyl compound has a weight average molecular weight between 2,000 and 50,000, such as 2,000, 10,000, 15,000, 20,000, 25,000, 30,000, 35,000, 40,000, 45,000 or 50,000, but the present disclosure is not limited thereto. For instance, the copolymer of phenylvinylsilane and alkenyl compound has a weight average molecular weight of 32,071. For instance, the copolymer of phenylvinylsilane and alkenyl compound has a weight average molecular weight of 3,686.

In one exemplary embodiment, the preparation method of the copolymer of phenylvinylsilane and alkenyl compound includes reacting 80 parts by weight to 98 parts by weight of the phenylvinylsilane and 2 parts by weight to 20 parts by weight of the alkenyl compound. In one exemplary embodiment, the reaction is carried out at 80° C. to 150° C. for 2 hours to 10 hours. In one exemplary embodiment, the preparation method of the copolymer of phenylvinylsilane and alkenyl compound further includes steps of purifying, filtering or drying.

In one exemplary embodiment, the reaction time may be between 2 hours and 10 hours, such as between 3 hours and 9 hours, or between 4 hours and 8 hours, or between 5 hours and 7 hours. In one exemplary embodiment, the reaction temperature may be between 80° C. and 150° C., such as between 90° C. and 140° C., or between 100° C. and 130° C., or between 110° C. and 120° C. In one exemplary embodiment, the purification is carried out by recrystallization using alcohol solvent.

In one exemplary embodiment, the preparation method further includes adding a curing accelerator, and the curing accelerator includes an initiator, a catalyst or a combination thereof. The amount of the curing accelerator is 0.1% to 1.5% of a sum of the weight of the phenylvinylsilane and the alkenyl compound, such as between 0.2% and 1.4%, or between 0.3% and 1.3%, or between 0.4% and 1.2%, or between 0.5% and 1.1%, or between 0.6% and 1.0%, or between 0.7% and 0.9%.

In one exemplary embodiment, the initiator is at least one of bis(tert-butylperoxyisopropyl)benzene, 2,5-dimethyl-2,5-di(tert-butylperoxy)-3-hexyne, dibenzoyl peroxide, 2,3-dimethyl-2,3-diphenylbutane, dicumyl peroxide, tert-butyl peroxybenzoate, tert-butyl peroxyisopropyl monocarbonate and azobisisobutylonitrile, but not limited thereto.

In one exemplary embodiment, the catalyst includes metal carboxylate.

In one exemplary embodiment, the preparation method further includes using a solvent, and the amount of the solvent is 0% to 100% of a sum of the weight of the phenylvinylsilane and the alkenyl compound, such as between 10% and 90%, or between 20% and 80%, or between 30% and 70%, or between 40% and 60%.

In one exemplary embodiment, the solvent is at least one of methanol, ethanol, ethylene glycol monomethyl ether, acetone, butanone (i.e. methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide and propylene glycol methyl ether, but not limited thereto.

In one exemplary embodiment, the phenylvinylsilane has a structure represented by Formula (1) and/or Formula (2), and the alkenyl compound has a structure represented by Formula (3):

Formula (1)

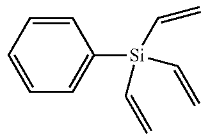

Formula (2)

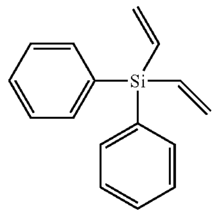

Formula (3)

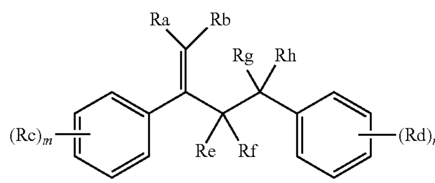

wherein each of Ra, Rb, Rc and Rd is independently H or a monovalent organic group, each of m and n is independently an integer of 0 to 5, and each of Re, Rf, Rg and Rh is independently H or a monovalent alkyl group with 1 to 4 carbon atoms.

In one exemplary embodiment, the monovalent organic group includes at least one of alkyl, alkoxy, substituted or unsubstituted aryl or benzyl and substituted or unsubstituted aryloxy or benzyloxy. For instance, the examples of the monovalent organic group include methyl, ethyl, propyl, butyl, tert-butyl, pentyl, hexyl, heptyl, octyl, nonyl, decyl, phenyl, benzyl, methoxy, ethoxy, propoxy, butoxy, phenoxy, benzyloxy and the like, but not limited thereto. In one exemplary embodiment, the monovalent organic group may be a monovalent alkyl group or alkyloxy group with 1 to 10 carbon atoms. In one exemplary embodiment, the monovalent organic group may be a monovalent alkyl group or alkyloxy group with 1 to 4 carbon atoms.

In one exemplary embodiment, the monovalent alkyl group with 1 to 4 carbon atoms may be methyl, ethyl, n-propyl, isopropyl, n-butyl, isobutyl, sec-butyl or tert-butyl.

In one exemplary embodiment, the copolymer of phenylvinylsilane and alkenyl compound includes a structural unit A and a structural unit B, the structural unit A has at least one of structures represented by Formula (5), Formula (6), Formula (7), Formula (8) and Formula (9), and the numbers of the structures represented by Formula (5), Formula (6), Formula (7), Formula (8) and Formula (9) in the copolymer of phenylvinylsilane and alkenyl compound are respectively J1, J2, J3, K1 and K2;

Formula (5)

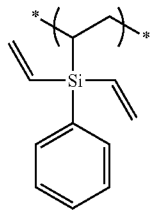

Formula (6)

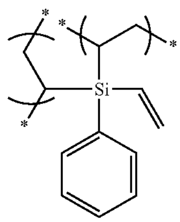

Formula (7)

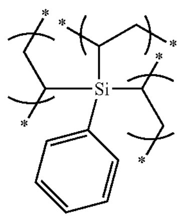

Formula (8)

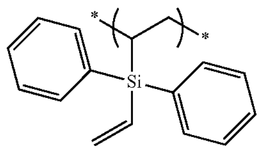

Formula (9)

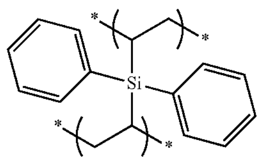

The structural unit B has a structure represented by Formula (10), and the number of the structure represented by Formula (10) in the copolymer of phenylvinylsilane and alkenyl compound is L1;

Formula (10)

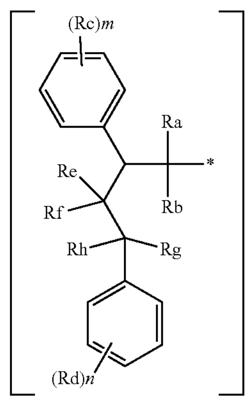

wherein the symbol "*" represents a bonding site, each of J1, J2, J3, K1 and K2 is independently 0 or a positive integer but not all 0 (that is, at least one of J1, J2, J3, K1 and K2 is not 0), L1 is a positive integer; and $10 \leq J1+J2+J3+L1 \leq 268$, or $8 \leq K1+K2+L1 \leq 212$, or $8 \leq J1+J2+J3+K1+K2+L1 \leq 268$.

For instance, in one exemplary embodiment, each of J1 and J2 is independently an integer greater than or equal to 1, and each of J3, K1 and K2 is independently an integer greater than or equal to 0. In one exemplary embodiment, each of J1, J2 and J3 is independently an integer greater than or equal to 0, and each of K1 and K2 is independently an integer greater than or equal to 1. In one exemplary embodiment, each of J1, J2, K1 and K2 is independently an integer greater than or equal to 1, and J3 is an integer greater than or equal to 0.

In one exemplary embodiment, the copolymer of phenylvinylsilane and alkenyl compound has structures represented by Formula (5), Formula (6), Formula (7) and Formula (10), and the numbers thereof are such as J1+J2+J3+L1=10, 20, 30, 40, 50, 60, 70, 80, 90, 100, 110, 120, 130, 140, 150, 160, 170, 180, 190, 200, 210, 220, 230, 240, 250, 260 or 268, but the present disclosure is not limited thereto. In one exemplary embodiment, the copolymer of phenylvinylsilane and alkenyl compound has structures represented by Formula (8), Formula (9) and Formula (10), and the numbers thereof are such as K1+K2+L1=8, 10, 20, 30, 40, 50, 60, 70, 80, 90, 100, 110, 120, 130, 140, 150, 160, 170, 180, 190, 200, 210 or 212, but the present disclosure is not limited thereto. In one exemplary embodiment, the copolymer of phenylvinylsilane and alkenyl compound has structures represented by Formula (5), Formula (6), Formula (7), Formula (8), Formula (9) and Formula (10), and the numbers thereof are such as J1+J2+J3+K1+K2+L1=8, 10, 20, 30, 40, 50, 60, 70, 80, 90, 100, 110, 120, 130, 140, 150, 160, 170, 180, 190, 200, 210, 220, 230, 240, 250, 260 or 268, but the present disclosure is not limited thereto.

In one exemplary embodiment, the alkenyl compound has at least one of structures represented by Formula (11), Formula (12) and Formula (13):

2,4-diphenyl-4-methyl-1-pentene:

Formula (11)

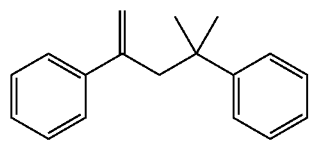

2,4-diphenyl-3,4-dimethyl-1-hexene:

Formula (12)

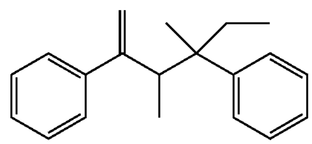

2,4-bis(p-methoxy)phenyl-4-methyl-1-pentene:

Formula (13)

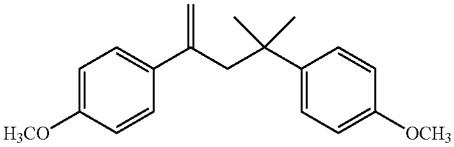

In one exemplary embodiment, the vinylbenzyl-terminated phenolic resin used in the present disclosure is a phenolic resin with a styryl group derived from reacting a hydroxyl group of a phenolic resin with a styryl-containing compound, and the styryl group is located at the terminal of the molecular structure of the resin or the branch chain of the molecular chain of the resin, or both the terminal and the branch chain.

In one exemplary embodiment, the vinylbenzyl-terminated phenolic resin has a structure represented by Formula (4):

Formula (4)

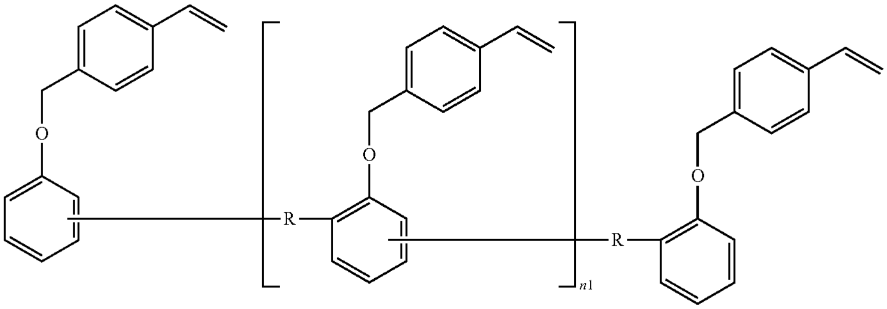

wherein R is a divalent organic group, and n1 is an integer of 1 to 30.

In one exemplary embodiment, the divalent organic group is at least one of alkylene, dicyclopentadienyl, substituted or unsubstituted arylene, a combination of alkylene and arylene (i.e. aralkylene or alkylene aryl) and heteroaryl.

In one exemplary embodiment, the alkylene is a linear alkyl or branched alkyl with 1 to 4 carbon atoms, the arylene is at least one of phenyl, naphthyl, anthracenyl, biphenyl and fluorenyl, and the heteroaryl is at least one of pyridine ring, pyrrole ring, pyrazole ring, pyrimidine ring, pyrazine ring, pyridazine ring, thiophene ring and furan ring. In one exemplary embodiment, R may be such as:

,
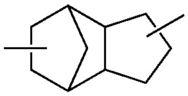,
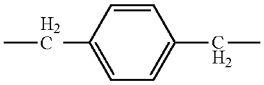,

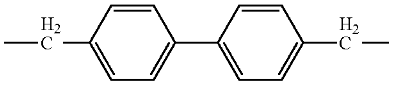 or

-continued

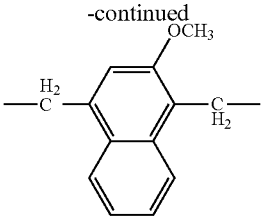, but the present disclosure is not limited thereto.

In one exemplary embodiment, R includes at least one of methylene, dicyclopentadienyl and substituted or unsubstituted arylene, and n1 is an integer of 1 to 10.

In one exemplary embodiment, the vinylbenzyl-terminated phenolic resin may be any one or more of commercially available products, self-made products or a combination thereof. In one exemplary embodiment, the vinylbenzyl-terminated phenolic resin is a product derived from reacting 4-vinylbenzyl chloride with phenolic resin in the presence of sodium hydroxide and tetrabutylammonium iodide or reacting 4-vinylbenzyl chloride with phenolic resin in the presence of sodium alkoxide (such as sodium methoxide or sodium ethoxide). The specific examples of the vinylbenzyl-terminated phenolic resin include at least one of a vinylbenzyl-terminated dicyclopentadiene-type phenolic resin (such as KPU-6270 available from Kolon Industries) (R is a divalent dicyclopentadienyl, and n1 is an integer of 1 to 10), a vinylbenzyl-terminated alkyl-type phenolic resin (R is methylene, and n1 is an integer of 1 to 10) and a vinylbenzyl-terminated biphenyl-type phenolic resin (R is 4,4'-dimethylene biphenyl, and n1 is an integer of 1 to 10), but the present disclosure is not limited thereto.

In one exemplary embodiment, with respect to 100 parts by weight of the copolymer of phenylvinylsilane and alkenyl compound, the resin composition may further include 0.1 parts by weight to 40 parts by weight of a polyolefin resin, preferably 5 parts by weight to 30 parts by weight. In one exemplary embodiment, the polyolefin resin is 5 parts by weight, 10 parts by weight, 15 parts by weight, 20 parts by weight or 25 parts by weight, but not limited thereto. In another exemplary embodiment, the resin composition may not include a polyolefin resin.

In one exemplary embodiment, the polyolefin resin include at least one of an unsaturated polyolefin resin and a hydrogenated unsaturated polyolefin resin. The unsaturated polyolefin resin herein may be any one or more of polyolefin resins containing an unsaturated carbon-carbon double bond applicable to the manufacture of a prepreg, a resin film, a laminate, a printed circuit board or a cured insulator. The specific examples include at least one of styrene-butadiene-divinylbenzene terpolymer, styrene-butadiene copolymer adducted with maleic anhydride, polybutadiene adducted with maleic anhydride, styrene-butadiene-styrene block copolymer, vinyl-polybutadiene-urethane oligomer, styrene-butadiene copolymer, styrene-isoprene copolymer, polybutadiene, ethylene propylene diene monomer (EPDM) rubber, methylstyrene homopolymer, petroleum resin and cyclic olefin copolymer, but the present disclosure is not limited thereto. The hydrogenated unsaturated polyolefin resin herein is derived by hydrogenating an unsaturated polyolefin resin and may be any one or more of hydrogenated unsaturated polyolefin resins without an unsaturated carbon-carbon double bond applicable to the manufacture of a prepreg, a resin film, a laminate, a printed circuit board or a cured insulator. The specific examples include at least one of hydrogenated styrene-butadiene copolymer, hydrogenated styrene-butadiene-styrene block copolymer and hydrogenated styrene-isoprene copolymer, but the present disclosure is not limited thereto.

In one exemplary embodiment, the resin composition further includes at least one of a vinyl group-containing polyphenylene ether resin, a maleimide resin, a maleimide triazine resin, a small molecule vinyl group-containing resin, a prepolymer of a small molecule vinyl group-containing resin, a styrene-maleic anhydride resin, an epoxy resin, a phenolic resin, a benzoxazine resin, a cyanate ester resin, a polyester resin, a polyamide resin and a polyimide resin.

For instance, in one exemplary embodiment, the vinyl group-containing polyphenylene ether resin may include various polyphenylene ether resins whose terminal is modified with a vinyl group or an allyl group, such as vinylbenzyl group-containing polyphenylene ether resin, alternatively, the vinyl group-containing polyphenylene ether resin may be (meth)acrylate-containing polyphenylene ether resin. For instance, the vinyl group-containing polyphenylene ether resin include vinylbenzyl biphenyl polyphenylene ether resin, methyacrylate-containing polyphenylene ether resin, vinylbenzyl group-containing bisphenol A polyphenylene ether resin, vinyl group-containing chain-extended polyphenylene ether resin or a combination thereof, but not limited thereto, the amount of the vinyl group-containing polyphenylene ether resin is not limited.

For instance, in one exemplary embodiment, the vinyl group-containing polyphenylene ether resin may include various vinyl group-containing polyphenylene ether resins known in this field. The vinyl group-containing polyphenylene ether resin applicable to the present disclosure may be one or more of commercially available products, self-made products or a combination thereof. In some exemplary embodiments, but the present disclosure is not limited thereto, one or more of the following vinyl group-containing polyphenylene ether resins may be used: vinylbenzyl group-containing biphenyl polyphenylene ether resin (such as OPE-2st, available from MITSUBISHI GAS CHEMICAL COMPANY, INC.), methacrylate-containing polyphenylene ether resin (such as SA9000, available from Sabic company), vinylbenzyl group-containing bisphenol A polyphenylene ether resin, vinyl group-containing chain-extended polyphenylene ether resin or a combination thereof. The vinyl group-containing chain-extended polyphenylene ether resin may include various polyphenylene ether resins disclosed in the US Patent Application Publication No. 2016/0185904 A1, all of which are incorporated herein by reference in their entirety.

For instance, in one exemplary embodiment, the maleimide resin used in the present disclosure refers to a compound or a mixture containing one or more maleimide group in the molecule, the maleimide resin used in the present disclosure may be any one or more of maleimide resins applicable to the manufacture of a prepreg, a resin film, a laminate, a printed circuit board or a cured insulator, but the present disclosure is not limited thereto. The specific examples include 4,4'-diphenylmethane bismaleimide, oligomer of phenylmethane maleimide, m-phenylene bismaleimide, bisphenol A diphenyl ether bismaleimide, 3,3'-dimethyl-5,5'-diethyl-4,4'-diphenyl methane bismaleimide, 4-methyl-1,3-phenylene bismaleimide, 1,6-bismaleimide-(2,2,4-trimethyl)hexane, 2,3-xylylmaleimide, 2,6-xylyl maleimide, N-phenylmaleimide, maleimide resin containing aliphatic long-chain structure or a combination thereof, but the present disclosure is not limited thereto. In addition, unless not specified, the maleimide resin herein also encompass a prepolymer of the resin, such as a prepolymer of diallyl compound and maleimide resin, a prepolymer of polyfunctional amine (including greater than or equal to two amino groups) and maleimide resin or a prepolymer of acidic phenolic compound and maleimide resin, but not limited thereto.

For instance, the maleimide resin may be maleimide resin products such as BMI-1000, BMI-1000H, BMI-1100, BMI-1100H, BMI-2000, BMI-2300, BMI-3000, BMI-3000H, BMI-4000H, BMI-5000, BMI-5100, BMI-7000 and BMI-7000H available from Daiwakasei Co., Ltd., or maleimide resin products such as BMI-70 and BMI-80 available from K.I Chemical Industry Co., Ltd.

For instance, the maleimide resin containing aliphatic long-chain structure may be maleimide resin products such as BMI-689, BMI-1400, BMI-1500, BMI-1700, BMI-2500, BMI-3000, BMI-5000 and BMI-6000 available from Designer Molecules Inc. For instance, the maleimide resin containing aliphatic long-chain structure may have at least one maleimide group linking with a substituted or unsubstituted long-chain aliphatic group. The long-chain aliphatic group may be C5 to C50 aliphatic group, such as C10 to C50, C20 to C50, C30 to C50, C20 to C40 or C30 to C40, but not limited thereto.

For instance, in one exemplary embodiment, the maleimide triazine resin herein may be any one or more of maleimide triazine resins applicable to the manufacture of a prepreg, a resin film, a laminate, a printed circuit board or a cured insulator, but the present disclosure is not limited thereto. For instance, the maleimide triazine resin may be derived by polymerizing cyanate ester resin and maleimide resin. The maleimide triazine resin may be derived by polymerizing bisphenol A cyanate ester resin and maleimide resin, by polymerizing bisphenol F cyanate ester resin and maleimide resin, by polymerizing phenol novolac cyanate ester resin and maleimide resin or by polymerizing dicyclopentadiene-containing cyanate ester resin and maleimide resin, but not limited thereto. For instance, the maleimide triazine resin may be derived by polymerizing cyanate ester resin and maleimide resin at any molar ratio. For instance, with respect to 1 mole of the maleimide resin, the cyanate ester resin may be 1 to 10 moles. For instance, with respect to 1 mole of the maleimide resin, the cyanate ester resin is 1, 2, 4 or 6 moles, but not limited thereto.

For instance, in one exemplary embodiment, the small molecule vinyl group-containing resin refers a alkenyl compound with a molecular weight less than or equal to 1,000, preferably a molecular weight between 100 and 900, more preferably a molecular weight between 100 and 800. For instance, the small molecule vinyl group-containing resin includes styrene, divinylbenzene, bis(vinylbenzyl) ether, 1,2,4-trivinylcyclohexane (TVCH), bis(vinylphenyl) ethane (BVPE), bis(vinylphenyl) hexane, bis(vinylphenyl) dimethyl ether, bis(vinylphenyl) dimethyl benzene, triallyl isocyanurate (TAIC) and/or triallyl cyanurate (TAC), but the present disclosure is not limited thereto.

For instance, in one exemplary embodiment, the prepolymer of the small molecule vinyl group-containing resin may include a prepolymer of styrene, a prepolymer of divinylbenzene, a prepolymer of bis(vinylbenzyl) ether, a prepolymer of 1,2,4-trivinylcyclohexane, a prepolymer of bis(vinylphenyl) ethane, a prepolymer of bis(vinylphenyl) hexane, a prepolymer of bis(vinylphenyl) dimethyl ether, a prepolymer of bis(vinylphenyl) dimethyl benzene, a prepolymer of triallyl isocyanurate, a prepolymer of triallyl cyanurate or a combination thereof, but not limited thereto. For instance, in one exemplary embodiment, the prepolymer of styrene means the amount of styrene in the prepolymer is greater than or equal to 50 wt %, for instance, the amount of styrene in the prepolymer of styrene is between 50 wt % and 99 wt % while the amount of the second monomer unit in the prepolymer of styrene is less than or equal to 49 wt %, such as between 1 wt % and 49 wt %. For instance, in one exemplary embodiment, the prepolymer of the prepolymer includes 60 wt % of styrene monomer unit, 30 wt % of divinylbenzene monomer unit and 10 wt % of ethyl styrene monomer unit. In another exemplary embodiment, the prepolymer of divinylbenzene includes 60 wt % of divinylbenzene monomer unit, 30 wt % of ethyl styrene monomer unit and 10 wt % of styrene monomer unit.

For instance, in one exemplary embodiment, in the styrene-maleic anhydride resin used in the present disclosure, the ratio of styrene (S) to maleic anhydride (MA) may be 1:1, 2:1, 3:1, 4:1, 6:1 or 8:1, such as styrene maleic anhydride copolymer products SMA-1000, SMA-2000, SMA-3000, EF-30, EF-40, EF-60 and EF-80 available from Cray Valley, or styrene maleic anhydride copolymer products C400, C500, C700 and C900 available from Polyscope, but the present disclosure is not limited thereto. In addition, the styrene-maleic anhydride resin may also be esterified styrene maleic anhydride, such as esterified styrene maleic anhydride products SMA1440, SMA17352, SMA2625, SMA3840 and SMA31890 available from Cray Valley, the styrene-maleic anhydride resin may be added individually or as a combination to the resin composition of the present disclosure.

For instance, in one exemplary embodiment, the epoxy resin used in the present disclosure may be various epoxy resins known in this field, including bisphenol A epoxy resin, bisphenol F epoxy resin, bisphenol S epoxy resin, bisphenol AD epoxy resin, novolac epoxy resin, trifunctional epoxy resin, tetrafunctional epoxy resin, multifunctional novolac epoxy resin, dicyclopentadiene (DCPD) epoxy resin, phosphorus-containing epoxy resin, p-xylene epoxy resin, naphthalene epoxy resin (such as naphthol epoxy resin), benzofuran epoxy resin, or isocyanate-modified epoxy resin, but the present disclosure is not limited thereto. The novolac epoxy resin may be phenol novolac epoxy resin, bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin. The phosphorus-containing epoxy resin may be 9,10-dihydro-9-oxa-10-phosphaphenanthrene-10-oxide (DOPO) epoxy resin, DOPO-HQ epoxy resin or a combination thereof. The DOPO epoxy resin may be any one or more selected from DOPO-containing phenolic novolac epoxy resin, DOPO-containing cresol novolac epoxy resin and DOPO-containing bisphenol-A novolac epoxy resin. The DOPO-HQ epoxy resin may be at least one selected from DOPO-HQ-containing phenolic novolac epoxy resin, DOPO-HQ-containing cresol novolac epoxy resin and DOPO-HQ-containing bisphenol-A novolac epoxy resin.

For instance, in one exemplary embodiment, the phenolic resin herein may be a monofunctional or multifunctional (greater than or equal to two phenolic hydroxyl group-including) phenolic resin or a combination thereof. The type of the phenolic resin may include various phenolic resins currently used in this field. Preferably, the phenolic resin is selected from phenoxy resin, phenolic resin or a combination thereof, but the present disclosure is not limited thereto.

For instance, in one exemplary embodiment, the benzoxazine resin herein may be bisphenol A benzoxazine resin, bisphenol F benzoxazine resin, phenolphthalein benzoxazine resin, dicyclopentadiene benzoxazine resin or phosphorus-containing benzoxazine resin, such as products LZ-8270 (phenolphthalein benzoxazine resin), LZ-8280 (bisphenol F benzoxazine resin) and LZ-8290 (bisphenol A benzoxazine resin) available from Huntsman or product HFB-2006M from Showa High Polymer.

For instance, in one exemplary embodiment, the cyanate ester resin herein may be various cyanate ester resins known in this field, and the cyanate ester resin include a cyanate ester resin with a structure of Ar—O—C≡N (wherein Ar is aryl group, such as phenyl, naphthyl or anthracenyl), phenol novolac cyanate ester resin, bisphenol A cyanate ester resin, bisphenol A novolac cyanate ester resin, bisphenol F cyanate ester resin, bisphenol F novolac cyanate ester resin, dicyclopentadiene-containing cyanate ester resin, naphthalene-containing cyanate ester resin, phenolphthalein cyanate ester resin or a combination thereof, but the present disclosure is not limited thereto. For instance, the specific examples of the cyanate ester resin include cyanate ester resin products Primaset PT-15, PT-30S, PT-60S, BA-200, BA-230S, BA-3000S, BTP-2500, BTP-6020S, DT-4000, DT-7000, ULL950S, HTL-300, CE-320, LVT-50 and LeCy available from Lonza, but the present disclosure is not limited thereto.

For instance, in one exemplary embodiment, the polyester resin herein is derived by esterification of an aromatic compound with two carboxylic groups and an aromatic compound with two hydroxyl groups, such as HPC-8000, HPC-8150 or HPC-8200 available from DIC Corporation, but the present disclosure is not limited thereto.

For instance, in one exemplary embodiment, the polyamide resin herein may be various polyamide resins known in this field, including various commercially available polyamide resin products, but the present disclosure is not limited thereto.

For instance, in one exemplary embodiment, the polyimide resin herein may be various polyimide resins known in this field, including various commercially available polyimide resin products, but the present disclosure is not limited thereto.

the ratio of the amount of the copolymer of phenylvinylsilane and alkenyl compound to resin additives is not limited.

In one exemplary embodiment, the resin composition further includes at least one of an amine curing agent, a flame retardant, an inorganic filler, a curing accelerator, a polymerization inhibitor, a coloring agent, a solvent, a toughening agent and a silane coupling agent.

For instance, in one exemplary embodiment, the amine curing agent herein may be at least one of dicyandiamide, diamino diphenyl sulfone, diamino diphenyl methane, diamino diphenyl ether and diamino diphenyl sulfide, but not limited thereto.

For instance, in one exemplary embodiment, the flame retardant herein may be any one or more of flame retardants applicable to the manufacture of a prepreg, a resin film, a laminate, a printed circuit board or a cured insulator. The specific examples include phosphorus-containing flame retardant, such as at least one or more selected from the following group: ammonium polyphosphate, hydroquinone bis-(diphenylphosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP) (such as commercially available products PX-200, PX-201, PX-202 and the like), phosphazene (such as commercially available products SPB-100, SPH-100, SPV-100 andthe like), melamine polyphosphate, DOPO and its derivatives or resins, diphenylphosphine oxide (DPPO) and its derivatives or resins, melamine cyanurate, tri-hydroxy ethyl isocyanurate, aluminium phosphinate (such as products OP-930, OP-935 and the like), but the present disclosure is not limited thereto.

For instance, the flame retardant used in the present disclosure may be a DPPO compound (e.g., di-DPPO compound), a DOPO compound (e.g., di-DOPO compound), a DOPO resin (e.g., DOPO-HQ, DOPO-NQ, DOPO-PN and DOPO-BPN), a DOPO-bonding epoxy resin, wherein DOPO-PN is a DOPO-containing phenol novolac compound, and DOPO-BPN may be a bisphenol novolac compound, such as DOPO-BPAN (DOPO-bisphenol A novolac), DOPO-BPFN (DOPO-bisphenol F novolac) or DOPO-BPSN (DOPO-bisphenol S novolac).

For instance, in one exemplary embodiment, the inorganic filler herein may be any one or more fillers applicable to the manufacture of a resin film, a prepreg, a laminate, a printed circuit board or a cured insulator. The specific examples include silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride or calcined kaolin, but the present disclosure is not limited thereto. In addition, the inorganic filler may be spherical, fibrous, plate-like, particulate, flake-like or whisker-like and may be optionally pretreated by a silane coupling agent.

In one exemplary embodiment, for instance, the curing accelerator (including curing initiator) herein may include a catalyst, such as a Lewis base or a Lewis acid. The Lewis base may include one or more of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP). The Lewis acid may include metal salt compounds, such as metal salt compounds of manganese, iron, cobalt, nickel, copper and zinc, or metal catalysts, such as zinc octanoate or cobalt octanoate. The curing accelerator also includes a curing initiator, such as a peroxide capable of producing free radicals. The curing initiator includes 2,3-dimethyl-2,3-diphenylbutane, dicumyl peroxide, tert-butyl peroxybenzoate, dibenzoyl peroxide (BPO), 2,5-dimethyl-2,5-di(tert-butylperoxy)-3-hexyne (25B), bis(tert-butylperoxyisopropyl)benzene, azobisisobutylonitrile or a combination thereof, but the present disclosure is not limited thereto.

In one exemplary embodiment, for instance, the polymerization inhibitor herein may be various polymerization inhibitors known in this field, including various commercially available polymerization inhibitor products, but the present disclosure is not limited thereto. For instance, the polymerization inhibitor may include 1,1-diphenyl-2-picrylhydrazyl radical, methyl acrylonitrile, dithioester, nitroxide-mediated radical, triphenylmethyl radical, metal ion radical, sulfur radical, hydroquinone, 4-methoxyphenol, p-benzoquinone, phenothiazine, β-phenylnaphthylamine, 4-t-butylcatechol, methylene blue, 4,4'-butylidene bis (6-t-butyl-3-methylphenol), 2,2'-methylene bis(4-ethyl-6-t-butylphenol) or a combination thereof, but the present disclosure is not limited thereto.

For instance, the nitroxide-mediated radical may include nitroxide radicals derived from cyclic hydroxylamines, such as 2,2,6,6-substituted piperidine 1-oxyl free radical or 2,2,5,5-substituted pyrrolidine 1-oxyl free radical, but the present disclosure is not limited thereto. As substitutes, alkyl groups with 4 or less carbon atoms, such as methyl group or ethyl group, are preferred. As the compound containing a nitroxide radical, specific examples include 2,2,6,6-tetramethylpiperidine 1-oxyl free radical, 2,2,6,6-tetraethylpiperidine 1-oxyl free radical, 2,2,6,6-tetramethyl-4-oxo-piperidine 1-oxyl free radical, 2,2,5,5-tetramethylpyrrolidine 1-oxyl free radical, 1,1,3,3-tetramethyl-2-isoindoline oxygen radical, N,N-di-tert-butylamine oxygen free radical and the like. The nitroxide radicals may also be replaced by stable radicals such as galvinoxyl radicals.

The polymerization inhibitor applicable to the resin composition of the present disclosure may also be products derived from the polymerization inhibitor with its hydrogen atom or group substituted by other atom or group, for instances, products derived from a polymerization inhibitor with its hydrogen atom substituted by an amino group, a hydroxyl group, a carbonyl group or the like.

In one exemplary embodiment, for instance, the coloring agent applicable to the present disclosure may include dye or pigment, but the present disclosure is not limited thereto.

In one exemplary embodiment, for instance, the purpose of adding solvent is to change the solid content of the resin composition and to adjust the viscosity of the resin composition. For instance, the solvent may include methanol, ethanol, ethylene glycol monomethyl ether, acetone, butanone (i.e. methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether or a mixture solvent thereof, but the present disclosure is not limited thereto. In some exemplary embodiments, the solvent added to the resin composition may be volatilized and removed during the process into a prepreg or a resin film, and the insulation layer of the prepreg or the resin film is allowed to contain no solvent or only a trace amount of less than or equal to 3 wt % of the solvent, and thus the presence or not of the solvent in the resin composition will not affect the properties of the product.

In one exemplary embodiment, for instance, the purpose of adding toughening agent is to improve the toughness of the resin composition. The toughening agent may include carboxyl-terminated butadiene acrylonitrile rubber (CTBN rubber), core-shell rubber or a combination thereof, but the present disclosure is not limited thereto.

In one exemplary embodiment, for instance, the silane coupling agent used in the present disclosure may include silane (such as siloxane, but the present disclosure is not limited thereto) and may be further categorized according to the functional groups into amino silane compound, epoxide silane compound, vinyl silane compound, acrylate silane compound, methacrylate silane compound, hydroxyl silane compound, isocyanate silane compound, methacryloxy silane compound and acryloxy silane compound.

In the second aspect, the present disclosure provides a product, the product is made from the above resin composition, and the product includes a prepreg, a resin film, a laminate, a printed circuit board or a cured insulator, but the present disclosure is not limited thereto.

For instance, the resin composition from each exemplary embodiment of the present disclosure may be made into a prepreg, which includes a reinforcement material and a layered structure disposed thereon. The layered structure is formed by heating the resin composition at a high temperature to the semi-cured state (B-stage). The baking temperature for making the prepreg may be between 100° C. and 200° C. The reinforcement material may be any one of fiber material, woven fabric and non-woven fabric, and the woven fabric preferably includes fiberglass fabrics. The types of the fiberglass fabrics are not particularly limited and may be any commercial fiberglass fabric used for various printed circuit boards, such as E-glass fabric, D-glass fabric, S-glass fabric, T-glass fabric, L-glass fabric or Q-glass fabric, wherein the fiber may include yarns and rovings, in spread form or standard form. The non-woven fabric preferably includes liquid crystal resin non-woven fabric, such as polyester non-woven fabric, polyurethane non-woven fabric and so on, but not limited thereto. The woven fabric may also include liquid crystal resin woven fabric, such as polyester woven fabric, polyurethane woven fabric and so on, but not limited thereto. The reinforcement material may increase the mechanical strength of the prepreg. In one preferred exemplary embodiment, the reinforcement material may be optionally pre-treated by a silane coupling agent. The prepreg may be further heated and cured to the C-stage to form an insulation layer.

For instance, the resin composition from each exemplary embodiment of the present disclosure may be made into a resin film, which is prepared by heating and baking to semi-cure the resin composition. The resin composition may be selectively coated on a polyethylene terephthalate film (PET film), a polyimide film (PI film), a copper foil or a resin-coated copper, followed by heating and baking to a semi-cured state so as to make the resin composition form into the resin film.

For instance, the resin composition from each exemplary embodiment of the present disclosure may be made into a laminate, which includes two metal foils and an insulation layer disposed between the metal foils, wherein the insulation layer is made by curing the resin composition at high temperature and high pressure to the C-stage, a suitable curing temperature may be between 180° C. and 250° C., preferably between 200° C. and 230° C., and a curing time may be 90 to 180 minutes, preferably 120 to 150 minutes. The insulation layer may be formed by curing the prepreg or the resin film to the C-stage. The metal foil may include copper, aluminum, nickel, platinum, silver, gold or alloy thereof, such as a copper foil.

Preferably, the laminate is a copper-clad laminate (CCL).

In addition, the laminate may be further processed by circuit formation processes to make a circuit board, such as a printed circuit board. One manufacturing method of the printed circuit board of the present disclosure may be as follows. A double-sided copper-clad laminate (such as product EM-890 available from Elite Material Co., Ltd.) with a thickness of 28 mil and having a 0.5 ounce (oz) HVLP (hyper very low profile) copper foil may be provided and subject to drilling and then electroplating, so as to form electrical conduction between the upper layer copper foil and the bottom layer copper foil. Then, the upper layer copper foil and the bottom layer copper foil are etched to form inner layer circuits. Then, brown oxidation and roughening are performed on the inner layer circuits to form uneven structure on the surface to increase roughness. Then, the copper foil, the prepreg, the inner layer circuits, the prepreg and the copper foil are stacked in sequence, and a vacuum lamination apparatus is used to heat them at 180° C. to 250° C. for 90 to 180 minutes to cure the insulation material of the prepregs. Then black oxidation, drilling, copper plating and other known circuit board processes are performed on the outmost surface copper foil so as to obtain the printed circuit board.

For instance, the resin composition from each exemplary embodiment of the present disclosure may be made into a cured insulator, which includes the resin composition in a cured state, the resin composition containing a reinforcement material in a cured state or a combination thereof. In one exemplary embodiment, the present disclosure provides a preparation method of a cured insulator, including directly curing the resin composition or curing the resin composition through multiple curing processes. The multiple curing refers to greater than or equal to two curing. For instance, the resin composition may be semi-cured to form the resin composition in a semi-cured state, and then the resin composition in the semi-cured state may be cured to form the resin composition in a cured state. Curing is preferably heating-curing.

In one exemplary embodiment, heating is baking-heating, semi-curing the resin composition means heating to a semi-curing temperature, and the semi-curing temperature may be between 100° C. and 200° C. In one exemplary embodiment, directly curing the resin composition or curing the resin composition in a semi-cured state means heating to a curing temperature, the curing temperature may be between 180° C. and 250° C., preferably between 200° C. and 230° C., and the curing time may be 90 to 180 minutes, preferably 120 to 150 minutes. In one exemplary embodiment, curing includes applying pressure to the resin composition or the resin composition in a semi-cured state.

In one exemplary embodiment, the cured insulator includes the resin composition in a cured state, which may be prepared by curing the resin film. In one exemplary embodiment, the cured insulator includes the resin composition containing a reinforcement material in a cured state, which may be prepared by curing the prepreg.

In one exemplary embodiment, the preparation method of the cured insulator further includes molding. For instance, the resin composition or the semi-cured resin composition may be put into a mold, and the resin composition or the semi-cured resin composition may be shaped and cured in the mold at the curing temperature and a certain pressure, thereby obtaining the cured insulator with a specific shape.

In one exemplary embodiment, the cured insulator is an insulation layer containing no metal on its surface which is prepared by removing the surface metal foil of the laminate or the printed circuit board.

Preferably, the resin composition or the product made therefrom of the present disclosure may have improvements in one or more of glass transition temperature, copper foil peeling strength, dielectric constant, dissipation factor, ratio of thermal expansion, coefficient of thermal expansion and thermal resistance in pressure cooking test.

In one exemplary embodiment, the product has a glass transition temperature as measured by reference to IPC-TM-650 2.4.24.4 of greater than or equal to 220° C., such as greater than or equal to 221° C., such as between 221° C. and 260° C.

In one exemplary embodiment, the product has a glass transition temperature as measured by reference to IPC-TM-650 2.4.24.5 of greater than or equal to 200° C., such as greater than or equal to 201° C., such as between 201° C. and 230° C.

In one exemplary embodiment, the product has a copper foil peeling strength as measured by reference to IPC-TM-650 2.4.8 of greater than or equal to 2.00 lb/in, such as between 2.00 lb/in and 3.00 lb/in.

In one exemplary embodiment, the product has a Z-axis ratio of thermal expansion as measured by reference to IPC-TM-650 2.4.24.5 of less than or equal to 1.4%, such as between 0.70% and 1.40%.

In one exemplary embodiment, the product has an X-axis coefficient of thermal expansion as measured by reference to IPC-TM-650 2.4.24.5 of less than or equal to 11.0 ppm/° C., such as between 7.5 ppm/° C. and 11.0 ppm/° C.

In one exemplary embodiment, the product has no delamination after a pressure cooking test for 5 hours by reference to IPC-TM-650 2.6.16.1 and then a thermal resistance test by reference to IPC-TM-650 2.4.23.

In one exemplary embodiment, the product has a dielectric constant at 10 GHz as measured by reference to JIS C2565 of less than or equal to 3.40, such as between 3.20 and 3.40; and/or the product has a dissipation factor at 10 GHz as measured by reference to JIS C2565 of less than or equal to 0.00300, such as between 0.00240 and 0.00300.

The present disclosure is further described with the following specific exemplary embodiments. The following exemplary embodiments and examples are illustrative in nature and are not intended to limit the present disclosure and its application.

The following raw materials are used to prepare Preparation Examples and Comparative Preparation Examples of the present disclosure according to the amounts listed in Table 1 and prepare the resin compositions of Examples and Comparative Examples of the present disclosure according to the amount listed in Tables 4 to Table 8, and further make them into samples or products.

The chemical raw materials used in Preparation Examples, Examples and Comparative Example of the present disclosure are as follows.

Phenyltrivinylsilane: available from Suzhou Siso New Material Co., Ltd., having the structure represented by the following Formula (1).

Formula (1)

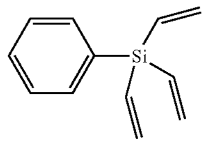

Diphenyldivinylsilane: available from Suzhou Siso New Material Co., Ltd., having the structure represented by the following Formula (2).

Formula (2)

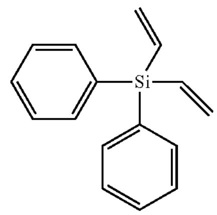

Methyltrivinylsilane: commercially available from any source.

Tetraphenyldivinyldisiloxane: commercially available from any source.

2,4-diphenyl-4-methyl-1-pentene: available from Aladdin, having the structure represented by the following Formula (11).

Formula (11)

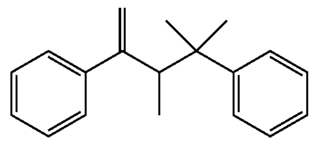

2,4-diphenyl-3,4-dimethyl-1-hexane: synthesized according to Synthesis Example 1, having the structure represented by the following Formula (12).

Formula (12)

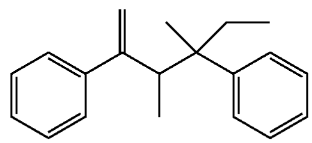

2,4-bis(p-methoxy)phenyl-4-methyl-1-pentene: synthesized according to Synthesis Example 2, having the structure represented by the following Formula (13).

Formula (13)

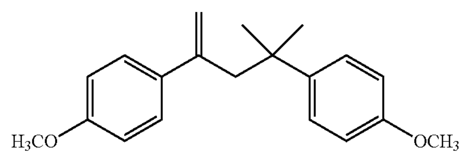

1,4-naphthoquinone: available from Aladdin.

n-dodecylmercaptan: available from Aladdin.

KPU-6270: vinylbenzyl-terminated dicyclopentadiene-type phenolic resin, available from Kolon Industries, having the structure represented by the following Formula (14).

Formula (14)

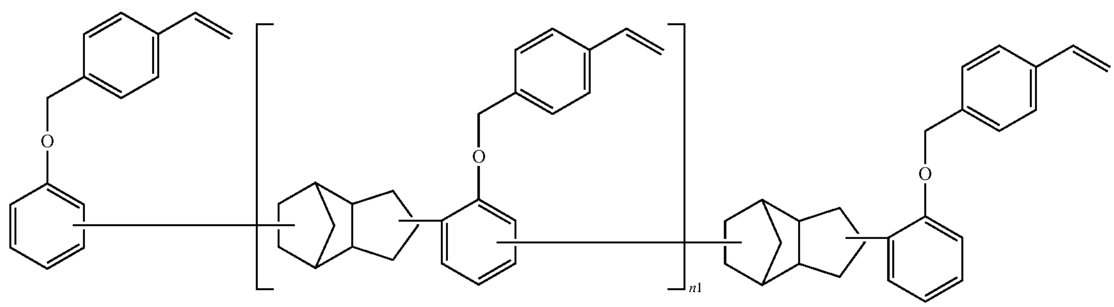

Vinylbenzyl-terminated alkyl-type phenolic resin: synthesized according to Synthesis Example 3, having the structure represented by the following Formula (15).

Formula (15)

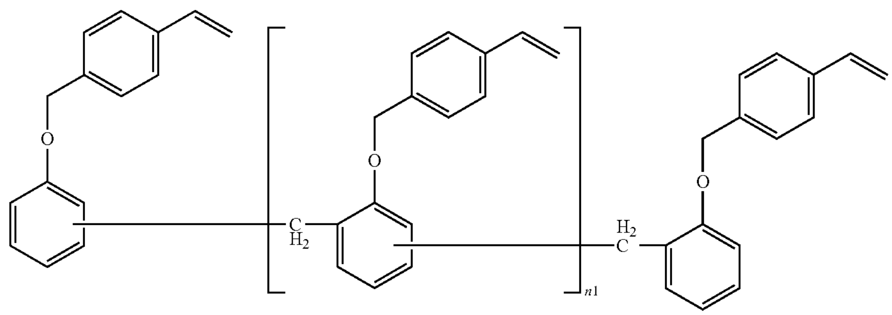

Vinylbenzyl-terminated biphenyl-type phenolic resin: synthesized according to Synthesis Example 4, having the structure represented by the following Formula (16).

Formula (16)

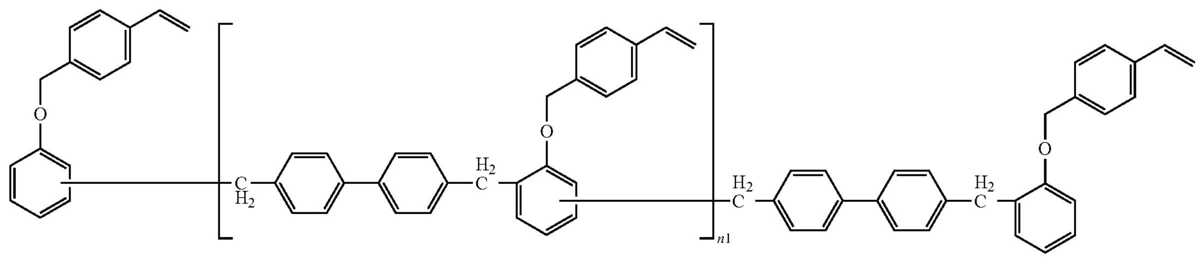

TUFTEC® H1051: hydrogenated styrene-butadiene-styrene triblock copolymer (SEBS), available from Asahi Kasei.

MD1648: hydrogenated styrene-butadiene-styrene triblock copolymer (SEBS), available from Kraton.

SBS-C: styrene-butadiene-styrene triblock copolymer, available from Nippon Soda.

EBT-4045M: ethylene propylene diene monomer (EPDM) rubber, available from Shanghai Sinopec Mitsui Chemicals, Co., Ltd.

Ricon 100: styrene-butadiene copolymer, available from Cray Valley.

Ricon 184MA6: styrene-butadiene copolymer adducted with maleic anhydride, available from Cray Valley.

Ricon 257: styrene-butadiene-divinylbenzene terpolymer, available from Cray Valley.

SA9000: methacrylate-terminated polyphenylene ether resin, available from Sabic.

OPE-2st 1200: vinylbenzyl-terminated polyphenylene ether resin, available from Sabic.

SC-2050 SMJ: spherical silica with surfaces treated with a silane coupling agent, available from Admatechs.

25B: 2,5-dimethyl-2,5-di(tert-butylperoxy)-3-hexyne, available from Nippon Oils & Fats.

Butanone: commercially available from any source.

Toluene: available from Chambeco.

Synthesis Example 1

The synthesis example provides a synthesis method of 2,4-diphenyl-3,4-dimethyl-1-hexane, including the following steps:

20 g but-1-en-2-ylbenzene (available from Aladdin) and 10 g toluene are added to a flask and stirred to be mixed evenly, then 0.2 g p-toluenesulfonic acid monohydrate is added therein, the flask is purged with N2, the reaction is carried out at 20° C. for 20 hours, and 2 mL water is added to stop the reaction. The reaction mixture is diluted with 20 g ethyl acetate, the organic phase is washed with water, dried, filtered, and rotary evaporated to remove solvent, thereby obtaining 2,4-diphenyl-3,4-dimethyl-1-hexane.

Synthesis Example 2

The synthesis example provides a synthesis method of 2,4-bis(p-methoxy)phenyl-4-methyl-1-pentene, including the following steps:

The difference from Synthesis Example 1 is: replacing but-1-en-2-ylbenzene with 20 g 1-isopropenyl-4-methoxybenzene (available from Aladdin), thereby obtaining 2,4-bis (p-methoxy)phenyl-4-methyl-1-pentene.

Synthesis Example 3

The synthesis example provides a synthesis method of vinylbenzyl-terminated alkyl-type phenolic resin, including the following steps:

105 g alkyl-type phenolic resin (containing 1.0 mol phenolic hydroxyl) (TD-2090, R is methylene, hydroxyl equivalent 105 g/eq, available from DIC Corporation), 1.05 mol 4-vinylbenzyl chloride and 150 g toluene are put into a reactor with the temperature set at 70° C., stirred and reacted for 6 hours, and 1.05 mol sodium hydroxide and 0.07 mol tetrabutylammonium iodide are added and reacted for 4 hours. After the reaction is completed, the reaction mixture is washed with methanol and water and dried, thereby obtaining vinylbenzyl-terminated alkyl-type phenolic resin in which R is methylene.

Synthesis Example 4

The synthesis example provides a synthesis method of vinylbenzyl-terminated biphenyl-type phenolic resin, including the following steps:

The difference between Synthesis Example 3 is: replacing the alkyl-type phenolic resin with 220 g biphenyl-type phenolic resin (containing 1.0 mol phenolic hydroxyl) (BPNH9781, R is 4,4'-dimethylene biphenyl, hydroxyl equivalent 215-225 g/eq, available from JIASHENGDE), thereby obtaining vinylbenzyl-terminated biphenyl-type phenolic resin in which R is 4,4'-dimethylene biphenyl.

Preparation of Copolymers

The raw materials (in parts by weight) of the copolymers prepared by Preparation Examples and Comparative Preparation Examples of the present disclosure are shown in Table 1. The blanks in the table represent “0”.

TABLE 1

The raw materials of Preparation Examples and Comparative Preparation Example

| Raw materials | Example | | | | | | | | | | | | | | | | | |
|---|---|---|---|---|---|---|---|---|---|---|---|---|---|---|---|---|---|---|
| | Preparation Examples | | | | | | | | | Comparative Preparation Examples | | | | | | | | |
| (in parts by weight) | 1 | 2 | 3 | 4 | 5 | 6 | 7 | 8 | 9 | 1 | 2 | 3 | 4 | 5 | 6 | 7 | 8 | 9 |
| Phenyltrivinylsilane | 98 | 95 | 90 | 85 | 80 | 60 | | 90 | 90 | 100 | | | 75 | | | | 90 | 90 |
| Diphenyldivinylsilane | | | | | | 30 | 90 | | | | | 100 | | | | | | |
| Methyltrivinylsilane | | | | | | | | | | | | | | 90 | | | | |
| Tetraphenyldivinyldisiloxane | | | | | | | | | | | | | | | 90 | | | |
| Vinyltriethoxysilane | | | | | | | | | | | | | | | | 90 | | |
| 2,4-diphenyl-4-methyl-1-pentene | 2 | 5 | 10 | 15 | 20 | 10 | 10 | | | | 100 | | 25 | 10 | 10 | 10 | | |
| 2,4-diphenyl-3,4-dimethyl-1-hexane | | | | | | | | 10 | | | | | | | | | | |
| 2,4-bis(p-methoxy)phenyl-4-methyl-1-pentene | | | | | | | | | 10 | | | | | | | | | |
| 1,4-naphthoquinone | | | | | | | | | | | | | | | | | 10 | |
| n-dodecylmercaptan | | | | | | | | | | | | | | | | | | 10 |

Preparation Example 1

The preparation example provides a preparation method of the copolymer of phenylvinylsilane and alkenyl compound, including the following steps:

(1) Under a nitrogen atmosphere, 98 parts by weight of phenyltrivinylsilane, 2 parts by weight of 2,4-diphenyl-4-methyl-1-pentene, 0.5 parts by weight of 2,5-dimethyl-2,5-di(tert-butylperoxy)-3-hexyne (referred as 25B) and 40 parts by weight of toluene are added to a three-neck flask, heated to 120° C., stirred for 5 hours, and cooled to room temperature after the reaction is completed, thereby obtaining Crude Product 1.

(2) Under stirring, Crude Product 1 is slowly poured into absolute ethanol, a white precipitate is precipitated, then suction filtered, washed with absolute ethanol to obtain White Solid 1, and White Solid 1 is placed in a vacuum drying oven at 50° C. to 70° C. for 6 hours to 10 hours to remove the remaining solvent, thereby obtaining White Solid 2 (i.e. Product 2), which is Copolymer 1, in which the amount of the structural unit formed of phenyltrivinylsilane is 98 mol %.

Preparation Example 2

The preparation example provides a preparation method of the copolymer of phenylvinylsilane and alkenyl compound, and the difference from Preparation Example 1 is: 95 parts by weight of phenyltrivinylsilane and 5 parts by weight of 2,4-diphenyl-4-methyl-1-pentene are added, thereby obtaining Copolymer 2, in which the amount of the structural unit formed of phenyltrivinylsilane is 94 mol %.

Preparation Example 3

The preparation example provides a preparation method of the copolymer of phenylvinylsilane and alkenyl compound, and the difference from Preparation Example 1 is: 90 parts by weight of phenyltrivinylsilane and 10 parts by weight of 2,4-diphenyl-4-methyl-1-pentene are added, thereby obtaining Copolymer 3, in which the amount of the structural unit formed of phenyltrivinylsilane is 92 mol %.

Preparation Example 4

The preparation example provides a preparation method of the copolymer of phenylvinylsilane and alkenyl compound, and the difference from Preparation Example 1 is: 85 parts by weight of phenyltrivinylsilane and 15 parts by weight of 2,4-diphenyl-4-methyl-1-pentene are added, thereby obtaining Copolymer 4, in which the amount of the structural unit formed of phenyltrivinylsilane is 88 mol %.

Preparation Example 5

The preparation example provides a preparation method of the copolymer of phenylvinylsilane and alkenyl compound, and the difference from Preparation Example 1 is: 80 parts by weight of phenyltrivinylsilane and 20 parts by weight of 2,4-diphenyl-4-methyl-1-pentene are added, thereby obtaining Copolymer 5, in which the amount of the structural unit formed of phenyltrivinylsilane is 84 mol %.

Preparation Example 6

The preparation example provides a preparation method of the copolymer of phenylvinylsilane and alkenyl compound, and the difference from Preparation Example 1 is: 98 parts by weight of phenyltrivinylsilane is replaced with 60 parts by weight of phenyltrivinylsilane and 30 parts by weight of diphenyldivinylsilane, and 2 parts by weight of 2,4-diphenyl-4-methyl-1-pentene is replaced with 10 parts by weight of 2,4-diphenyl-4-methyl-1-pentene, thereby obtaining Copolymer 6, in which the amount of the structural unit formed of phenyltrivinylsilane and diphenyldivinylsilane is 91 mol %.

Preparation Example 7

The preparation example provides a preparation method of the copolymer of phenylvinylsilane and alkenyl compound, and the difference from Preparation Example 3 is: phenyltrivinylsilane is replaced with diphenyldivinylsilane, thereby obtaining Copolymer 7, in which the amount of the structural unit formed of diphenyldivinylsilane is 90 mol %.

Preparation Example 8

The preparation example provides a preparation method of the copolymer of phenylvinylsilane and alkenyl compound, and the difference from Preparation Example 3 is: 2,4-diphenyl-4-methyl-1-pentene is replaced with 2,4-diphenyl-3,4-dimethyl-1-hexane prepared from Synthesis Example 1, thereby obtaining Copolymer 8, in which the amount of the structural unit formed of phenyltrivinylsilane is 92 mol %.

Preparation Example 9

The preparation example provides a preparation method of the copolymer of phenylvinylsilane and alkenyl compound, and the difference from Preparation Example 3 is: 2,4-diphenyl-4-methyl-1-pentene is replaced with 2,4-bis(p-methoxy)phenyl-4-methyl-1-pentene prepared from Synthesis Example 2, thereby obtaining Copolymer 9, in which the amount of the structural unit formed of phenyltrivinylsilane is 93 mol %.

Comparative Preparation Example 1

The comparative preparation example provides a preparation method of the copolymer, and the difference from Preparation Example 1 is: 100 parts by weight of phenyltrivinylsilane and no 2,4-diphenyl-4-methyl-1-pentene are added, thereby obtaining Comparative Homopolymer 1.

Comparative Preparation Example 2

The comparative preparation example provides a preparation method of the copolymer, and the difference from Preparation Example 1 is: 100 parts by weight of 2,4-diphenyl-4-methyl-1-pentene and no phenylvinylsilane are added, thereby obtaining Comparative Homopolymer 2.

Comparative Preparation Example 3

The comparative preparation example provides a preparation method of the copolymer, and the difference from Comparative Preparation Example 1 is: phenyltrivinylsilane is replaced with diphenyldivinylsilane, thereby obtaining Comparative Homopolymer 3.

Comparative Preparation Example 4

The comparative preparation example provides a preparation method of the copolymer, and the difference from Preparation Example 1 is: 75 parts by weight of phenyltrivinylsilane and 25 parts by weight of 2,4-diphenyl-4-methyl-1-pentene are added, thereby obtaining Comparative Copolymer 4.

Comparative Preparation Example 5

The comparative preparation example provides a preparation method of the copolymer, and the difference from Preparation Example 3 is: phenyltrivinylsilane is replaced with methyltrivinylsilane, thereby obtaining Comparative Copolymer 5.

Comparative Preparation Example 6

The comparative preparation example provides a preparation method of the copolymer, and the difference from Preparation Example 3 is: phenyltrivinylsilane is replaced with tetraphenyldivinyldisiloxane, thereby obtaining Comparative Copolymer 6.

Comparative Preparation Example 7

The comparative preparation example provides a preparation method of the copolymer, and the difference from Preparation Example 3 is: phenyltrivinylsilane is replaced with vinyltriethoxysilane, thereby obtaining Comparative Copolymer 7.

Comparative Preparation Example 8

The comparative preparation example provides a preparation method of the copolymer, and the difference from Preparation Example 3 is: 2,4-diphenyl-4-methyl-1-pentene is replaced with 1,4-naphthoquinone, thereby obtaining Comparative Copolymer 8.

Comparative Preparation Example 9

The comparative preparation example provides a preparation method of the copolymer, and the difference from Preparation Example 3 is: 2,4-diphenyl-4-methyl-1-pentene is replaced with n-dodecylmercaptan, thereby obtaining Comparative Copolymer 9.

FIG. 1 is an IR spectrum of Copolymer 3, phenyltrivinylsilane and 2,4-diphenyl-4-methyl-1-pentene, wherein a is an IR spectrum of 2,4-diphenyl-4-methyl-1-pentene, b is an IR spectrum of phenyltrivinylsilane, and c is an IR spectrum of Copolymer 3. The characteristic absorption peak at 1590 $cm^{-1}$ is the IR characteristic absorption peak indicative of "C═C" double bond. Compared to 2,4-diphenyl-4-methyl-1-pentene and phenyltrivinylsilane, the characteristic absorption peak of Copolymer 3 at 1590 $cm^{-1}$ is obviously weakened, and this indicates some "C═C" double bonds in Copolymer 3 undergo an addition reaction. In addition, the peaks at 1428 $cm^{-1}$ and 1110 $cm^{-1}$ are the IR characteristic absorption peaks indicative of "phenyl-Si", and the peaks at 1401 $cm^{-1}$, 1006 $cm^{-1}$ and 950 $cm^{-1}$ are the IR characteristic absorption peaks indicative of "vinyl-Si". Comparing the IR spectrum of phenyltrivinylsilane and Copolymer 3, the characteristic absorption peaks of "phenyl-Si" of both have no obvious difference, but the characteristic absorption peaks of "vinyl-Si" of Copolymer 3 are obviously weaker than those of phenyltrivinylsilane, and this also indicates some vinyl groups in Copolymer 3 undergo an addition reaction.

Figure 2:
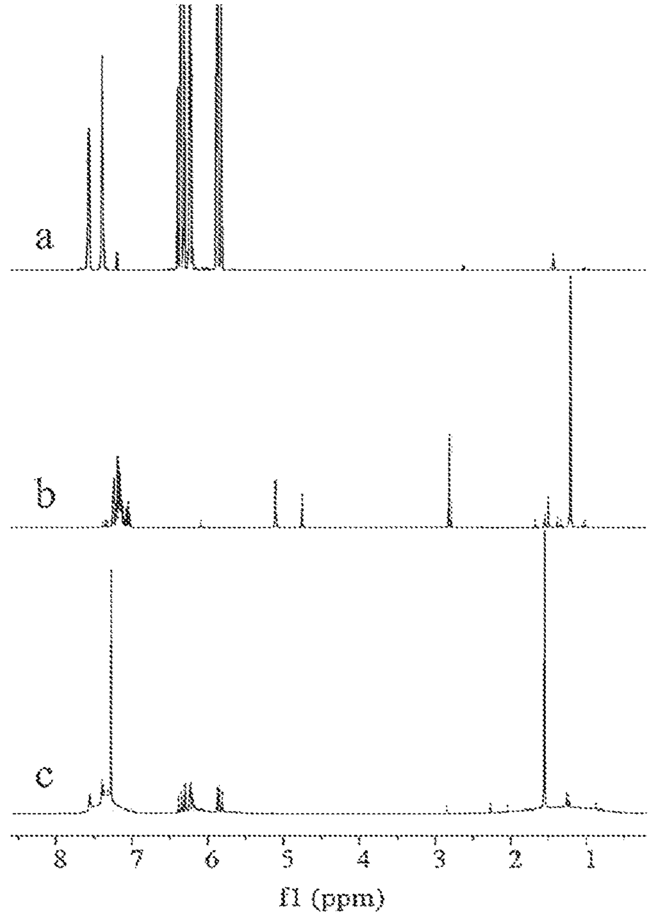
FIG. 2 is an H-NMR spectrum of Copolymer 3 of the present disclosure, phenyltrivinylsilane and 2,4-diphenyl-4-methyl-1-pentene; wherein a is for phenyltrivinylsilane, b is for 2,4-diphenyl-4-methyl-1-pentene, and c is for Copolymer 3.

FIG. 2 is an H-NMR spectrum of Copolymer 3, phenyltrivinylsilane and 2,4-diphenyl-4-methyl-1-pentene (the standard is TMS (tetramethylsilane)), wherein a is an H-NMR spectrum of phenyltrivinylsilane, b is an H-NMR spectrum of 2,4-diphenyl-4-methyl-1-pentene, and c is an H-NMR spectrum of Copolymer 3. 7.0-7.5 ppm is the characteristic peak region for benzene ring, 4.5-6.5 ppm is the characteristic peak region for "C═C" (which of phenyltrivinylsilane and Copolymer 3 is at 5.5-6.5 ppm, and which of 2,4-diphenyl-4-methyl-1-pentene is at 4.5-5.5 ppm), and 1.0-1.5 ppm is the characteristic peak region for $—CH_3$. It can be found that the characteristic peaks of "C═C" of Copolymer 3 at 5.5-6.5 ppm are obviously weaker than those of phenyltrivinylsilane; the characteristic peaks of "C═C" of 2,4-diphenyl-4-methyl-1-pentene at 4.5-5.5 ppm disappear after copolymerization; and the characteristic peak of "$—CH_3$" which is only derived from 2,4-diphenyl-4-methyl-1-pentene appear at 1.5 ppm in the spectrum of Copolymer 3. From this, it can be seen that phenyltrivinylsilane and 2,4-diphenyl-4-methyl-1-pentene undergo a copolymerization reaction to form Copolymer 3 of phenyltrivinylsilane-2,4-diphenyl-4-methyl-1-pentene.

Figure 3:
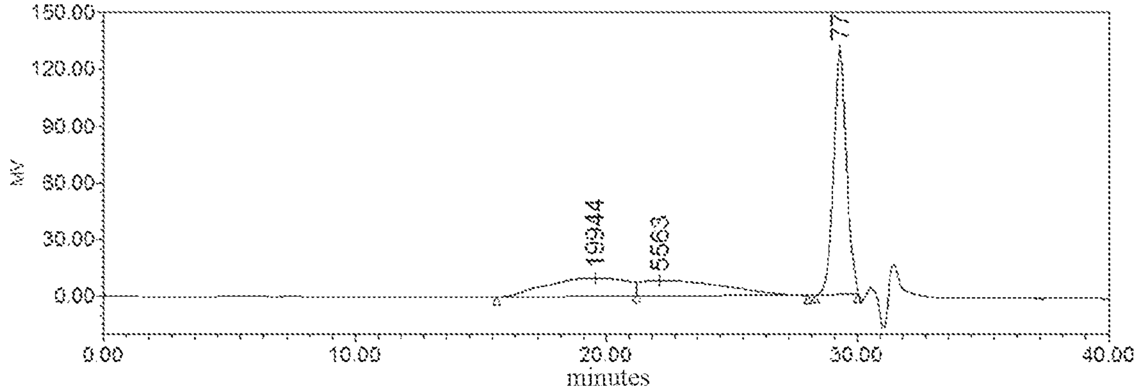
FIG. 3 is a gel permeation chromatogram of Copolymer 3 of the present disclosure.

FIG. 3 and Table 2 are a gel permeation chromatogram of the crude product of Copolymer 3. From the chromatogram, it can be seen that the crude product contains polymers with weight average molecular weights of 32,071 and 3,686, this proves that Copolymer 3 of the present disclosure has a higher weight average molecular weight than other raw material monomers, and thus Copolymer 3 indeed undergoes a copolymerization reaction.

TABLE 2

The gel permeation chromatogram of the crude product

| Name | Retention time (min) | Mn (Dalton) | Mw (Dalton) | MP (Dalton) | Polydispersity | Area (%) |
|---|---|---|---|---|---|---|
| Peak 1 | 19.550 | 20,839 | 32,071 | 19,944 | 1.539022 | 24.75 |
| Peak 2 | 22.125 | 2,234 | 3,686 | 5,563 | 1.650171 | 22.17 |
| Peak 3 | 29.308 | 73 | 79 | 77 | 1.080875 | 53.09 |

Tests for the Copolymers/Comparative Homopolymers

Test for Non-Volatile Parts 1 g of each of the unpurified crude products of the copolymers of the preparation examples and the comparative homopolymers of the comparative preparation examples, or unreacted monomer compounds is weighed in a tray, wherein each contains solvent with a theoretical value of a1 gram and non-solvent part with a theoretical value of (1−a1) gram. After baking in an oven at 170° C. for 1 hour, the weight after cooling is weighed as a2 gram, and the non-volatile part is calculated by [a2/(1−a1)]×100%. The results are shown in Table 3.

TABLE 3

The test results of the non-volatile parts in the crude products of the copolymers of the preparation examples and the homopolymers of the comparative preparation examples, and the monomers

| | Substance | Non-volatile part |
|---|---|---|
| The crude product of Preparation Example 3 | The copolymer of phenyltrivinylsilane:2,4-diphenyl-4-methyl-1-pentene = 90:10 | 30-80% |
| The crude product of Preparation Example 7 | The copolymer of diphenyldivinylsilane:2,4-diphenyl-4-methyl-1-pentene = 90:10 | 30-80% |
| The crude product of Comparative Preparation Example 1 | The homopolymer of phenyltrivinylsilane | 10-30% |
| The crude product of Comparative Preparation Example 2 | The homopolymer of 2,4-diphenyl-4-mathyl-1-pentene | 10-30% |
| The crude product of Comparative Preparation Example 3 | The homopolymer of diphenyldivinylsilane | 10-30% |
| Monomer compounds | phenyltrivinylsilane | <1% |
| | 2,4-diphenyl-4-methyl-1-pentene | <1% |
| | diphenyldivinylsilane | <1% |

It can be seen that compared to the raw materials of phenylvinylsilane and 2,4-diphenyl-4-methyl-1-pentene and the homopolymers of the monomers, non-volatile part of each of the copolymers of the preparation examples is obviously increased and the volatility is greatly reduced.

This is because phenylvinylsilane and 2,4-diphenyl-4-methyl-1-pentene are low-viscosity liquids at room temperature and have lower boiling points, and they are easily volatilized when baking at above 150° C.; the monomer conversion rate in homopolymerization of phenylvinylsilane or 2,4-diphenyl-4-methyl-1-pentene is low, and the homopolymerization reaction is difficult to control so that a copolymer with uniform molecular weight cannot be obtained and its non-volatile part is low; while through copolymerization of phenylvinylsilane and 2,4-diphenyl-4-methyl-1-pentene, a copolymer with an appropriate molecular weight and not volatile at high temperatures can be obtained.

Preparation of the Resin Compositions and the Products Thereof of the Examples and Comparative Examples The preparation method of the resin composition of the present disclosure is used, the specific steps are as follows.

Preparation of Varnish

The components of each Examples (abbreviated as E, such as E1 to E21) or Comparative Examples (abbreviated as C, such as C1 to C18) are added to a stirrer according to the amounts listed in Table 4 to Table 8 for stirring and well-mixing to form a resin composition, which is referred as resin varnish.

Take Example E1 for instance, 100 parts by weight of Copolymer 1 is added to a stirrer containing a proper amount of toluene and a proper amount of butanone and stirred to be dissolved completely, then 50 parts by weight of KPU-6270 is added thereto and well-mixed, then 150 parts by weight of spherical silica SC-2050 SMJ is added thereto and stirred to be well dispersed, and then 0.5 parts by weight of the curing accelerator (25B, pre-dissolved to a solution by a proper amount of solvent) are added thereto and stirred for 1 hour, thereby obtaining the varnish of the resin composition E1.

"Proper amount" (abbreviated as "PA") of butanone or toluene in Table 4 to Table 8 represents the amount of the solvent used to achieve a desirable solid content of the resin composition. For the resin composition using both butanone and toluene, "proper amount" (abbreviated as "PA") represents the amount of the two solvents used to achieve a desirable solid content of the resin composition, such as 70 wt %, but the present disclosure is not limited thereto.

TABLE 4

The components of the resin composition of Examples (in parts by weight) (PA indicates proper amount.)

| | Components | E1 | E2 | E3 | E4 | E5 | E6 | E7 |
|---|---|---|---|---|---|---|---|---|
| Copolymers | Copolymer 1 | | | | | 100 | | |
| | Copolymer 2 | | | | | | 100 | |
| | Copolymer 3 | 100 | 100 | 100 | 100 | | | |
| | Copolymer 4 | | | | | | | 100 |
| | Copolymer 5 | | | | | | | |
| Vinylbenzyl-terminated phenolic resin | KPU-6270 | 50 | | | 50 | 50 | 50 | 50 |
| | Vinylbenzyl-terminated alkyl-type phenolic resin | | 50 | | | | | |
| | Vinylbenzyl-terminated biphenyl-type phenolic resin | | | 50 | | | | |
| Polyolefin | TUFTEC ®H1051 | | | | 20 | 20 | 20 | 20 |
| | MD1648 | | | | | | | |
| | SBS-C | | | | | | | |
| | EBT-4045M | | | | | | | |
| | Ricon 100 | | | | | | | |
| | Ricon 184MA6 | | | | | | | |
| | Ricon 257 | | | | | | | |
| Vinyl group-containing polyphenylene ether | SA9000 | | | | | | | |
| | OPE-2st 1200 | | | | | | | |

TABLE 4-continued

| The components of the resin composition of Examples (in parts by weight) (PA indicates proper amount.) | | | | | | | | |
|---|---|---|---|---|---|---|---|---|
| | Components | E1 | E2 | E3 | E4 | E5 | E6 | E7 |
| Filler | SC-2050 SMJ | 150 | 150 | 150 | 170 | 170 | 170 | 170 |
| Accelerator | 25B | 0.5 | 0.5 | 0.5 | 0.5 | 0.5 | 0.5 | 0.5 |
| Solvent | Butanone | PA | PA | PA | PA | PA | PA | PA |
| | Toluene | PA | PA | PA | PA | PA | PA | PA |

TABLE 5

| The components of the resin composition of Examples (in parts by weight) (PA indicates proper amount.) | | | | | | | | |
|---|---|---|---|---|---|---|---|---|
| | Components | E8 | E9 | E10 | E11 | E12 | E13 | E14 |
| Copolymers | Copolymer 3 | | | | | | 100 | 100 |
| | Copolymer 4 | | | | | | | |
| | Copolymer 5 | 100 | | | | | | |
| | Copolymer 6 | | 100 | | | | | |
| | Copolymer 7 | | | 100 | | | | |
| | Copolymer 8 | | | | 100 | | | |
| | Copolymer 9 | | | | | 100 | | |
| Vinylbenzyl-terminated phenolic resin | KPU-6270 | 50 | 50 | 50 | 50 | 50 | 20 | 100 |
| | Vinylbenzyl-terminated alkyl-type phenolic resin | | | | | | | |
| | Vinylbenzyl-terminated biphenyl-type phenolic resin | | | | | | | |
| Polyolefin | TUFTEC ®H1051 | 20 | 20 | 20 | 20 | 20 | 20 | 20 |
| | MD1648 | | | | | | | |
| | SBS-C | | | | | | | |
| | EBT-4045M | | | | | | | |
| | Ricon 100 | | | | | | | |
| | Ricon 184MA6 | | | | | | | |
| | Ricon 257 | | | | | | | |
| Vinyl group-containing polyphenylene ether | SA9000 | | | | | | | |
| | OPE-2st 1200 | | | | | | | |
| Filler | SC-2050 SMJ | 170 | 170 | 170 | 170 | 170 | 140 | 220 |
| Accelerator | 25B | 0.5 | 0.5 | 0.5 | 0.5 | 0.5 | 0.5 | 0.5 |
| Solvent | Butanone | PA | PA | PA | PA | PA | PA | PA |
| | Toluene | PA | PA | PA | PA | PA | PA | PA |

TABLE 6

| The components of the resin composition of Examples (in parts by weight) (PA indicates proper amount.) | | | | | | | | |
|---|---|---|---|---|---|---|---|---|
| | Components | E15 | E16 | E17 | E18 | E19 | E20 | E21 |
| Copolymer | Copolymer 3 | 100 | 100 | 100 | 100 | 100 | 100 | 100 |
| Vinylbenzyl-terminated phenolic resin | KPU-6270 | 50 | 50 | 50 | 50 | 50 | 50 | 50 |
| | Vinylbenzyl-terminated alkyl-type phenolic resin | | | | | | | |
| | Vinylbenzyl-terminated biphenyl-type phenolic resin | | | | | | | |
| Polyolefin | TUFTEC ®H1051 | 5 | 30 | | | 10 | 10 | 5 |
| | MD1648 | | | 20 | | | | |
| | SBS-C | | | | 20 | | | |
| | EBT-4045M | | | | | 10 | | |
| | Ricon 100 | | | | | | 10 | |
| | Ricon 184MA6 | | | | | | | 10 |
| | Ricon 257 | | | | | | | 5 |
| Vinyl group-containing polyphenylene ether | SA9000 | | | | | 40 | | 70 |
| | OPE-2st 1200 | | | | | | 40 | |

TABLE 6-continued

| The components of the resin composition of Examples (in parts by weight) (PA indicates proper amount.) | | | | | | | | |
|---|---|---|---|---|---|---|---|---|
| Components | | E15 | E16 | E17 | E18 | E19 | E20 | E21 |
| Filler | SC-2050 SMJ | 155 | 180 | 170 | 170 | 315 | 105 | 240 |
| Accelerator | 25B | 0.5 | 0.5 | 0.5 | 0.5 | 0.2 | 1.2 | 0.5 |
| Solvent | Butanone | PA | PA | PA | PA | PA | PA | PA |
| | Toluene | PA | PA | PA | PA | PA | PA | PA |

TABLE 7

| The components of the resin composition of Comparative Examples (in parts by weight) (PA indicates proper amount.) | | | | | | | | | | |
|---|---|---|---|---|---|---|---|---|---|---|
| Components | | C1 | C2 | C3 | C4 | C5 | C6 | C7 | C8 | C9 |
| Copolymer | Copolymer 3 | | | | | | | | | |
| | Comparative Homopolymer 1 | 100 | | | | | | | | |
| | Comparative Homopolymer 2 | | 100 | | | | | | | |
| | Comparative Homopolymer 3 | | | 100 | | | | | | |
| | Comparative Copolymer 4 | | | | 100 | | | | | |
| | Comparative Copolymer 5 | | | | | 100 | | | | |
| | Comparative Copolymer 6 | | | | | | | | 100 | |
| | Comparative Copolymer 7 | | | | | | | | | 100 |
| | Comparative Copolymer 8 | | | | | | 100 | | | |
| | Comparative Copolymer 9 | | | | | | | 100 | | |
| Vinylbenzyl-terminated phenolic resin | KPU-6270 | 50 | 50 | 50 | 50 | 50 | 50 | 50 | 50 | 50 |
| Polyolefin | TUFTEC ®H1051 | 20 | 20 | 20 | 20 | 20 | 20 | 20 | 20 | 20 |
| Diphenyldivinylsilane | | | | | | | | | | |
| Phenyltrivinylsilane | | | | | | | | | | |
| 2,4-diphenyl-4-methyl-1-pentene | | | | | | | | | | |
| Filler | SC-2050 SMJ | 170 | 170 | 170 | 170 | 170 | 170 | 170 | 170 | 170 |
| Accelerator | 25B | 0.5 | 0.5 | 0.5 | 0.5 | 0.5 | 0.5 | 0.5 | 0.5 | 0.5 |
| Solvent | Butanone | PA | PA | PA | PA | PA | PA | PA | PA | PA |
| | Toluene | PA | PA | PA | PA | PA | PA | PA | PA | PA |

TABLE 8

| The components of the resin composition of Comparative Examples (in parts by weight) (PA indicates proper amount.) | | | | | | | | | | |
|---|---|---|---|---|---|---|---|---|---|---|
| Components | | C10 | C11 | C12 | C13 | C14 | C15 | C16 | C17 | C18 |
| Copolymer | Copolymer 3 | 100 | 100 | 100 | | | | | | |
| Vinylbenzyl-terminated phenolic resin | KPU-6270 | 15 | 110 | 50 | 50 | 50 | 50 | 50 | 50 | 50 |
| Polyolefin | TUFTEC ®H1051 | 20 | 20 | 40 | 20 | 20 | 20 | 20 | 20 | 20 |
| Diphenyldivinylsilane | | | | | 100 | | | 90 | | 30 |
| Phenyltrivinylsilane | | | | | | 100 | | | 90 | 60 |
| 2,4-diphenyl-4-methyl-1-pentene | | | | | | | 100 | 10 | 10 | 10 |
| Filler | SC-2050 SMJ | 135 | 230 | 190 | 170 | 170 | 170 | 170 | 170 | 170 |
| Accelerator | 25B | 0.5 | 0.5 | 0.5 | 0.5 | 0.5 | 0.5 | 0.5 | 0.5 | 0.5 |
| Solvent | Butanone | PA | PA | PA | PA | PA | PA | PA | PA | PA |
| | Toluene | PA | PA | PA | PA | PA | PA | PA | PA | PA |

Preparation of Product

1. Prepreg 1

The vanish of each of Examples E1 to E21 and each of Comparative Examples C1 to C18 is respectively loaded into an impregnation tank, and a fiberglass (e.g. 2116 L-glass fiber fabric) is impregnated into the impregnation tank to adhere the resin composition onto the fiberglass fabric, followed by heating at 120° C. to 170° C. to make the resin composition in a semi-cured state (B-Stage), thereby obtaining Prepreg 1 (the resin content about 50%).

2. Prepreg 2

The vanish of each of Examples E1 to E21 and each of Comparative Examples C1 to C18 is respectively loaded into an impregnation tank, and a fiberglass (e.g. 1078 L-glass fiber fabric) is impregnated into the impregnation tank to adhere the resin composition onto the fiberglass fabric, followed by heating at 120° C. to 170° C. to make the resin composition in a semi-cured state (B-Stage), thereby obtaining Prepreg2 (the resin content about 70%).

3. Copper-Clad Laminate 1

Two 18 μm (Hoz) hyper very low profile 3 copper foils (HVLP3 copper foil) and eight Prepregs 1 made from the resin composition of each Examples and Comparative Examples (using 2116 L-glass fiber fabric, the resin content of each prepreg is about 50%) are prepared. They are stacked in a sequence of "one aforementioned copper foil/eight Prepregs 1/one aforementioned copper foil" and laminated at a vacuum condition and 200° C. for 130 minutes to form Copper-Clad Laminate 1. The eight Prepregs 1 stacked with each other are cured to C-stage and formed an insulation layer between the two copper foils, and the resin content of the insulation layer is about 50%.

4. Copper-Clad Laminate 2

Two 18 μm (Hoz) hyper very low profile 3 copper foils (HVLP3 copper foil) and two Prepregs 1 made from the resin composition of each Examples and Comparative Examples (using 2116 L-glass fiber fabric, the resin content of each prepreg is about 50%) are prepared. They are stacked in a sequence of "one aforementioned copper foil/two Prepregs 1/one aforementioned copper foil" and laminated at a vacuum condition and 200° C. for 130 minutes to form Copper-Clad Laminate 2. The two Prepregs 1 stacked with each other are cured to C-stage and formed an insulation layer between the two copper foils, and the resin content of the insulation layer is about 50%.

5. Copper-Clad Laminate 3

Two 18 μm (Hoz) hyper very low profile 3 copper foils (HVLP3 copper foil) and two Prepregs 2 made from the resin composition of each Examples and Comparative Examples (using 1078 L-glass fiber fabric, the resin content of each prepreg is about 70%) are prepared. They are stacked in a sequence of "one aforementioned copper foil/two Prepregs 2/one aforementioned copper foil" and laminated at a vacuum condition and 200° C. for 130 minutes to form Copper-Clad Laminate 3. The two Prepregs 2 stacked with each other are cured to C-stage and formed an insulation layer between the two copper foils, and the resin content of the insulation layer is about 70%.

6. Copper-Free Laminate 1

The above Copper-Clad Laminate 1 (obtained by laminating eight Prepregs 1) are etched to remove the two copper foils, thereby obtaining Copper-Free Laminate 1, which is formed by laminating eight Prepregs 1 and has a resin content of about 50%.

7. Copper-Free Laminate 2

The above Copper-Clad Laminate 2 (obtained by laminating two Prepregs 1) are etched to remove the two copper foils, thereby obtaining Copper-Free Laminate 2, which is formed by laminating two Prepregs 1 and has a resin content of about 50%.

8. Copper-Free Laminate 3

The above Copper-Clad Laminate 3 (obtained by laminating two Prepregs 2) are etched to remove the two copper foils, thereby obtaining Copper-Free Laminate 3, which is formed by laminating two Prepreg2 and has a resin content of about 70%.

Property Analysis and Test of Product

1. Glass Transition Temperature (Tg)

In the measurement of glass transition temperature, Copper-Free Laminate 1 is used as a sample and subjected to dynamic mechanical analysis (DMA). The sample is heated at a rate of 2° C. per minute from 35° C. to 300° C., and the glass transition temperature (° C.) of the sample is measured by reference to IPC-TM-650 2.4.24.4.

Similarly, Copper-Free Laminate 1 is used as a sample and subjected to thermal mechanical analysis (TMA). The sample is heated at a rate of 10° C. per minute from 35° C. to 300° C., and the glass transition temperature (° C.) of the sample is measured by reference to IPC-TM-650 2.4.24.5

In this field, higher glass transition temperature is preferable. The difference in the glass transition temperatures of greater than or equal to 5° C. represents a significant difference (i.e., significant technical difficulty) in the glass transition temperatures of different laminates. For instance, the product made from the resin composition of the present disclosure has a glass transition temperature (DMA-Tg) as measured by reference to IPC-TM-650 2.4.24.4 of greater than or equal to 220° C., such as greater than or equal to 221° C., such as between 221° C. and 260° C., and has a glass transition temperature (TMA-Tg) as measured by reference to IPC-TM-650 2.4.24.5 of greater than or equal to 200° C., such as greater than or equal to 201° C., such as between 201° C. and 230° C.

2. Copper Foil Peeling Strength (P/S)

The above Copper-Clad Laminate 1 is cut into a rectangular sample with a width of 24 mm and a length of greater than 60 mm and etched to remove the surface copper foil, leaving a rectangular copper foil with a width of 3.18 mm and a length of greater than 60 mm. The sample is tested by a tensile strength tester by reference to IPC-TM-650 2.4.8 at normal temperature (about 25° C.) to measure the force (lb/in) required to pull off the copper foil from the laminate surface.

In this field, higher copper foil peeling strength is preferable. The difference in copper foil peeling strengths of greater than or equal to 0.1 lb/in represents a significant difference (i.e., significant technical difficulty). For instance, the product made from the resin composition of the present disclosure has a copper foil peeling strength as measured by reference to IPC-TM-650 2.4.8 of greater than or equal to 2.00 lb/in, such as between 2.00 lb/in and 3.00 lb/in.

3. Ratio of Thermal Expansion

In the measurement of ratio of thermal expansion (or ratio of dimensional change), the above Copper-Free Laminate 1 is used as a sample and subjected to thermal mechanical analysis (TMA). The sample is heated at a rate of 10° C. per minute from 35° C. to 265° C., and a Z-axis ratio of dimensional change (in the interval of 50° C.-260° C., %) of the sample is measured by reference to IPC-TM-650 2.4.24.5, and lower ratio of dimensional change is preferable.

In general, a high Z-axis ratio of thermal expansion of a laminate indicates a high ratio of dimensional change. For a copper-clad laminate, a high ratio of dimensional change may result in displacement of circuits at junctions during processing printed circuit boards (such as blind vias or buried vias, but the present disclosure is not limited thereto) to reduce yield, or reliability problems, such as delamination. In this field, lower ratio of thermal expansion is preferable, and the difference in ratio of thermal expansion of greater than or equal to 0.1% represents a significant difference. For instance, the product made from the resin composition of the present disclosure has a Z-axis ratio of thermal expansion as measured by reference to IPC-TM-650 2.4.24.5 of less than or equal to 1.40%, such as between 0.70% and 1.40%.

4. X-Axis Coefficient of Thermal Expansion (CTE)

In the measurement of X-axis coefficient of thermal expansion, the above Copper-Free Laminate 2 (obtained by laminating two prepregs, the resin content is about 50%) is used as a sample and subjected to thermal mechanical analysis (TMA). The above Copper-Free Laminate is cut into a sample with a length of 15 mm and a width of 2 mm, and the thickness of the sample is 8.4 mil. The sample is heated at a rate of 5° C. per minute from 50° C. to 260° C., and an X-axis coefficient of thermal expansion (ppm/° C.) of the sample at a temperature range ($\alpha1$) of 40° C. to 125° C. is measured by reference to IPC-TM-650 2.4.24.5.

In general, lower X-axis coefficient of thermal expansion represents a better dimensional change property. The difference in X-axis coefficient of thermal expansion of greater than or equal to 0.1 ppm/° C. represents a significant difference (i.e., significant technical difficulty). For instance, the product made from the resin composition of the present disclosure has a low X-axis coefficient of thermal expansion as measured by reference to IPC-TM-650 2.4.24.5, such as an X-axis coefficient of thermal expansion of less than or equal to 11.0 ppm/° C., such as between 7.5 ppm/° C. and 11.0 ppm/° C.

5. Thermal Resistance after Moisture Absorption (Pressure Cooking Test, PCT)

The above sample of Copper-Free Laminate 1 is subjected to a pressure cooking test (PCT) by reference to IPC-TM-650 2.6.16.1 for 5 hours of moisture absorption (test temperature 121° C. and relative humidity 100%), then immersed into a solder bath of 288° C. for 20 seconds by reference to IPC-TM-650 2.4.23, and then inspected for the presence of delamination, for instance, interlayer delamination between the insulation lays. The interlayer delamination may cause blistering and separation between any layers of the laminate, which can be observed by visual inspection.

For instance, the product made from the resin composition of the present disclosure has no delamination after moisture absorption for 5 hours by reference to IPC-TM-650 2.6.16.1 and IPC-TM-650 2.4.23. The absence of delamination is designated as "pass", and the occurrence of delamination is designated as "fail".

6. Dielectric Constant (Dk) and Dissipation Factor (Df)

The above Copper-Free Laminate 3 is used as a sample. The sample is measured at 10 GHz using a microwave dielectrometer (available from AET Corp.) by reference to JIS C2565.

In this field, lower dielectric constant or lower dissipation factor represents a better dielectric property of a sample. At a measurement frequency of 10 GHz, for a Dk value less than or equal to 3.50 and a Df value less than or equal to 0.004, the difference in Dk values of greater than or equal to 0.05 represents a significant difference (i.e., significant technical difficulty) in the dielectric constants of different laminates, and the difference in Dk values of less than 0.05 represents no significant difference in the dielectric constants of laminates. The difference in Df values of less than 0.00005 represents no significant difference in the dissipation factors of laminates, and the difference in Df values of greater than or equal to 0.00005 represents a significant difference (i.e., significant technical difficulty) in the dissipation factors of different laminates. For instance, the product made from the resin composition of the present disclosure has a dielectric constant at 10 GHz as measured by reference to JIS C2565 of less than or equal to 3.40, such as between 3.20 and 3.40, and a dissipation factor at 10 GHz as measured by reference to JIS C2565 of less than or equal to 0.00300, such as between 0.00240 and 0.00300.

The properties of Examples and Comparative Examples tested according to the above methods are shown in Table 9 to Table 13.

TABLE 9

The properties of the resin composition of Examples

| Property | Unit | E1 | E2 | E3 | E4 | E5 | E6 | E7 |
|---|---|---|---|---|---|---|---|---|
| DMA-Tg | ° C. | 249 | 238 | 253 | 242 | 247 | 243 | 239 |
| TMA-Tg | ° C. | 220 | 212 | 223 | 211 | 215 | 213 | 210 |
| P/S | lb/in | 2.0 | 2.0 | 2.2 | 2.4 | 2.4 | 2.4 | 2.4 |
| Z-axis ratio of thermal expansion | % | 0.80 | 0.95 | 0.75 | 1.00 | 1.40 | 1.20 | 1.15 |
| X-CTE | ppm/° C. | 9.7 | 10.2 | 9.5 | 9.0 | 11.0 | 9.0 | 9.5 |
| PCT (5 hr) | None | pass | pass | pass | pass | pass | pass | pass |
| Dk | None | 3.40 | 3.40 | 3.38 | 3.38 | 3.35 | 3.36 | 3.39 |
| Df | None | 0.00290 | 0.00288 | 0.00285 | 0.00262 | 0.00260 | 0.00261 | 0.00263 |

TABLE 10

| The properties of the resin composition of Examples | | | | | | | | |
|---|---|---|---|---|---|---|---|---|
| Property | Unit | E8 | E9 | E10 | E11 | E12 | E13 | E14 |
| DMA-Tg | ° C. | 234 | 225 | 221 | 235 | 248 | 230 | 260 |
| TMA-Tg | ° C. | 210 | 204 | 201 | 210 | 215 | 210 | 230 |
| P/S | lb/in | 2.5 | 2.6 | 2.7 | 2.4 | 2.6 | 2.6 | 2.4 |
| Z-axis ratio of thermal expansion | % | 1.40 | 1.10 | 1.10 | 1.05 | 1.05 | 1.05 | 0.70 |
| X-CTE | ppm/° C. | 11.0 | 9.2 | 9.5 | 9.0 | 9.0 | 9.5 | 7.5 |
| PCT (5 hr) | None | pass | pass | pass | pass | pass | pass | pass |
| Dk | None | 3.40 | 3.38 | 3.38 | 3.38 | 3.38 | 3.20 | 3.40 |
| Df | None | 0.00264 | 0.00258 | 0.00254 | 0.00264 | 0.00280 | 0.00240 | 0.00300 |

TABLE 11

| The properties of the resin composition of Examples | | | | | | | | |
|---|---|---|---|---|---|---|---|---|
| Property | Unit | E15 | E16 | E17 | E18 | E19 | E20 | E21 |
| DMA-Tg | ° C. | 245 | 237 | 250 | 238 | 237 | 236 | 240 |
| TMA-Tg | ° C. | 215 | 210 | 220 | 210 | 213 | 210 | 224 |
| P/S | lb/in | 2.4 | 2.6 | 2.4 | 2.5 | 2.4 | 2.4 | 3.0 |
| Z-axis ratio of thermal expansion | % | 0.85 | 1.08 | 0.80 | 0.85 | 1.00 | 1.00 | 0.98 |
| X-CTE | ppm/° C. | 8.3 | 9.2 | 8.2 | 8.3 | 9.2 | 9.0 | 9.0 |
| PCT (5 hr) | None | pass | pass | pass | pass | pass | pass | pass |
| Dk | None | 3.40 | 3.28 | 3.35 | 3.40 | 3.40 | 3.33 | 3.40 |
| Df | None | 0.00290 | 0.00240 | 0.00270 | 0.00275 | 0.00257 | 0.00280 | 0.00288 |

TABLE 12

| The properties of the resin composition of Comparative Examples | | | | | | | | | | |
|---|---|---|---|---|---|---|---|---|---|---|
| Property | Unit | C1 | C2 | C3 | C4 | C5 | C6 | C7 | C8 | C9 |
| DMA-Tg | ° C. | 255 | 216 | 210 | 223 | 215 | 248 | 210 | 206 | 190 |
| TMA-Tg | ° C. | 220 | 190 | 185 | 201 | 196 | 215 | 185 | 184 | 160 |
| P/S | lb/in | 1.60 | 1.60 | 1.70 | 2.50 | 1.80 | 2.50 | 2.60 | 2.00 | 2.80 |
| Z-axis ratio of thermal expansion | % | 1.50 | 1.60 | 1.60 | 1.40 | 1.40 | 1.20 | 1.45 | 1.50 | 1.50 |
| X-CTE | ppm/° C. | 11.5 | 12.0 | 12.0 | 11.0 | 10.0 | 9.0 | 11.5 | 11.7 | 13.0 |
| PCT(5 hr) | None | pass | fail | pass | fail | pass | pass | pass | pass | pass |
| Dk | None | 3.38 | 3.40 | 3.40 | 3.38 | 3.38 | 3.44 | 3.46 | 3.45 | 3.50 |
| Df | None | 0.00275 | 0.00355 | 0.00262 | 0.00330 | 0.00310 | 0.00370 | 0.00400 | 0.00320 | 0.00390 |

TABLE 13

| The properties of the resin composition of Comparative Examples | | | | | | | | | | |
|---|---|---|---|---|---|---|---|---|---|---|
| Property | Unit | C10 | C11 | C12 | C13 | C14 | C15 | C16 | C17 | C18 |
| DMA-Tg | ° C. | 205 | 270 | 220 | 160 | 235 | 180 | 163 | 230 | 185 |
| TMA-Tg | ° C. | 180 | 235 | 190 | 120 | 206 | 160 | 122 | 202 | 175 |
| P/S | lb/in | 2.00 | 2.00 | 2.50 | 1.40 | 1.90 | 1.50 | 1.30 | 1.80 | 1.65 |
| Z-axis ratio of thermal | % | 1.50 | 0.65 | 1.30 | 1.60 | 1.45 | 1.60 | 1.55 | 1.45 | 1.50 |

TABLE 13-continued

| The properties of the resin composition of Comparative Examples | | | | | | | | | | |
|---|---|---|---|---|---|---|---|---|---|---|
| Property | Unit | C10 | C11 | C12 | C13 | C14 | C15 | C16 | C17 | C18 |
| expansion | | | | | | | | | | |
| X-CTE | ppm/° C. | 11.0 | 7.4 | 10.5 | 15.0 | 11.9 | 14.0 | 14.5 | 11.6 | 13.0 |
| PCT(5 hr) | None | fail | pass | fail | fail | fail | fail | fail | fail | fail |
| Dk | None | 3.20 | 3.50 | 3.20 | 3.38 | 3.38 | 3.38 | 3.38 | 3.38 | 3.38 |
| Df | None | 0.00230 | 0.00330 | 0.00220 | 0.00268 | 0.00268 | 0.00266 | 0.00268 | 0.00268 | 0.00268 |

According to the test results in Table 9 to Table 13, it can be seen the following.

The copolymer of phenylvinylsilane and alkenyl compound contains some double bonds and has a higher cross-linking reactivity to further participate in a cross-linking reaction when added to the resin composition, while the properties of glass transition temperature, ratio of thermal expansion and dissipation factor of the product can also be simultaneously improved.

From Examples E1-E3, it can be confirmed that by using the copolymer of phenylvinylsilane and alkenyl compound of the present disclosure with the vinylbenzyl-terminated phenolic resins containing different R structures, all the products made therefrom can achieve some or all properties of high glass transition temperature, high copper foil peeling strength, low Z-axis ratio of thermal expansion, low X-axis coefficient of thermal expansion, excellent thermal resistance in pressure cooking test, low dielectric constant and low dissipation factor.

From comparing Examples E4-E10 and Comparative Examples C1-C4, it can be confirmed that by using the copolymer containing 80-98 parts by weight of phenylvinylsilane and 2-20 parts by weight of alkenyl compound in the present disclosure, compared to the copolymer and the homopolymer with the amounts beyond the above scopes, the product of the present disclosure can simultaneously achieve one, more, or all effects of increasing glass transition temperature, increasing copper foil peeling strength, decreasing Z-axis ratio of thermal expansion, decreasing X-axis coefficient of thermal expansion, passing pressure cooking test and decreasing dissipation factor.

From comparing Examples E4 and E9-E12 and Comparative Examples C5-C9, it can be confirmed that by using the copolymer of phenylvinylsilane and alkenyl compound of the present disclosure, compared to the compounds with monomer types beyond the above scopes, the product of the present disclosure can simultaneously achieve one, more, or all effects of increasing glass transition temperature, increasing copper foil peeling strength, decreasing Z-axis ratio of thermal expansion, decreasing X-axis coefficient of thermal expansion, decreasing dielectric constant and decreasing dissipation factor.

From comparing Examples E1, E4 and E13-E16 and Comparative Examples C10-C12, it can be confirmed that by using a combination of 100 parts by weight of the copolymer of phenylvinylsilane and alkenyl compound with 20-100 parts by weight of the vinylbenzyl-terminated phenolic resin or further combining 5-30 parts by weight of the polyolefin resin in the present disclosure, compared to the amount of the vinylbenzyl-terminated phenolic resin or the polyolefin beyond the above scopes, the product of the present disclosure can simultaneously achieve one, more, or all effects of increasing glass transition temperature, decreasing Z-axis ratio of thermal expansion, decreasing X-axis coefficient of thermal expansion, passing pressure cooking test, decreasing dielectric constant and decreasing dissipation factor.

From comparing Example E4 and Comparative Examples C14-C15 and C17, comparing Example E10 and Comparative Examples C13 and C15-C16, and comparing Example E9 and Comparative Example C18, it can be confirmed that by using the copolymer of phenylvinylsilane and alkenyl compound of the present disclosure, compared to using phenylvinylsilane alone, using alkenyl compound alone or using phenylvinylsilane and alkenyl compound which are not copolymerized, the product of the present disclosure can simultaneously achieve one, more, or all effects of increasing glass transition temperature, increasing copper foil peeling strength, decreasing Z-axis ratio of thermal expansion, decreasing X-axis coefficient of thermal expansion, passing pressure cooking test and decreasing dissipation factor.

From comparing Examples E1-E21 and Comparative Examples C1-C18, it can be confirmed that by using a combination of the copolymer containing 80-98 parts by weight of phenylvinylsilane and 2-20 parts by weight of alkenyl compound with 20-100 parts by weight of the vinylbenzyl-terminated phenolic resin or further combining 5-30 parts by weight of the polyolefin, the prepared laminate can simultaneously achieve the effects of a glass transition temperature (TMA-Tg) greater than or equal to 201° C., a Z-axis ratio of thermal expansion less than or equal to 1.40%, an X-axis coefficient of thermal expansion less than or equal to 11.0 ppm/° C. and a dissipation factor less than or equal to 0.00300, instead, Comparative Examples C1-C18 without the technical solutions of the present disclosure cannot achieve the above effects.

What is claimed is:

1. A resin composition, based on part by weight, comprising:

100 parts by weight of a copolymer of phenylvinylsilane and alkenyl compound and 20 parts by weight to 100 parts by weight of a vinylbenzyl-terminated phenolic resin;

wherein the copolymer of phenylvinylsilane and alkenyl compound comprises a structural unit formed of a phenylvinylsilane and an alkenyl compound; the raw material of the copolymer of phenylvinylsilane and alkenyl compound comprises the phenylvinylsilane and the alkenyl compound, based on a total weight of the phenylvinylsilane and the alkenyl compound being 100 parts by weight, the phenylvinylsilane is 80 parts by weight to 98 parts by weight, the alkenyl compound is 2 parts by weight to 20 parts by weight;

the phenylvinylsilane has a structure represented by Formula (1) and/or Formula (2), the alkenyl compound has a structure represented by Formula (3), and the vinylbenzyl-terminated phenolic resin has a structure represented by Formula (4):

Formula (1)

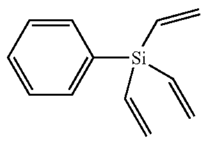

Formula (2)

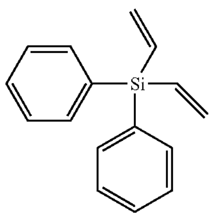

Formula (3)

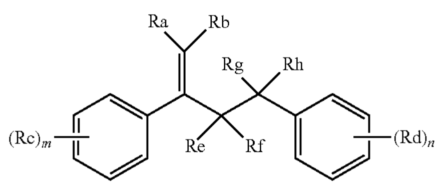

Formula (4)

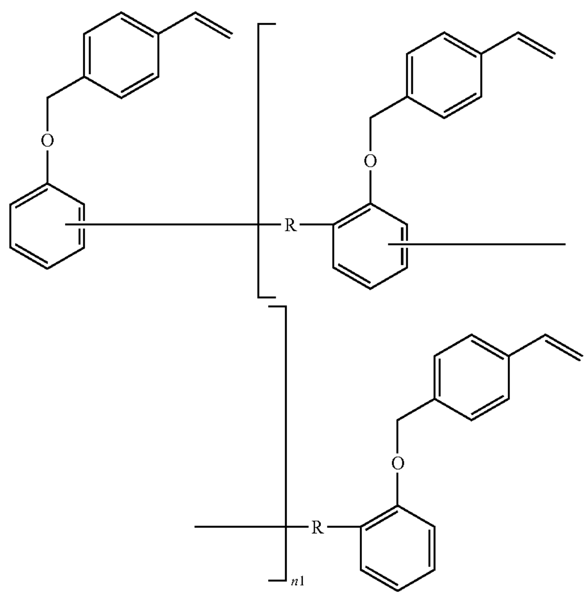

wherein each of Ra, Rb, Rc and Rd is independently H or a monovalent organic group, each of m and n is independently an integer of 0 to 5, each of Re, Rf, Rg and Rh is independently H or a monovalent alkyl group with 1 to 4 carbon atoms; and R is at least one of methylene, dicyclopentadienyl and substituted or unsubstituted arylene, and n1 is an integer of 1 to 10.

2. The resin composition of claim 1, wherein the copolymer of phenylvinylsilane and alkenyl compound has a weight average molecular weight of 2,000 to 50,000.

3. The resin composition of claim 1, wherein a preparation method of the copolymer of phenylvinylsilane and alkenyl compound comprises:

reacting 80 parts by weight to 98 parts by weight of the phenylvinylsilane and 2 parts by weight to 20 parts by weight of the alkenyl compound at 80° C. to 150° C. for 2 hours to 10 hours.

4. The resin composition of claim 3, wherein the preparation method of the copolymer of phenylvinylsilane and alkenyl compound further comprises adding an initiator, a catalyst or a combination thereof.

5. The resin composition of claim 1, wherein the copolymer of phenylvinylsilane and alkenyl compound comprises a structural unit A and a structural unit B, the structural unit A has at least one of structures represented by Formula (5), Formula (6), Formula (7), Formula (8) and Formula (9), the numbers of the structures represented by Formula (5), Formula (6), Formula (7), Formula (8) and Formula (9) in the copolymer of phenylvinylsilane and alkenyl compound are respectively J1, J2, J3, K1 and K2;

Formula (5)

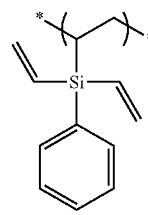

Formula (6)

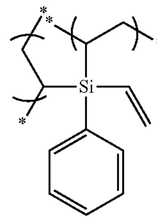

Formula (7)

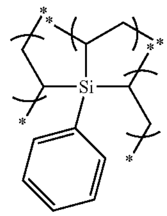

Formula (8)

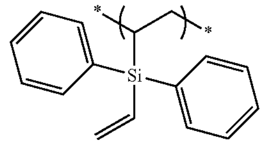

Formula (9)

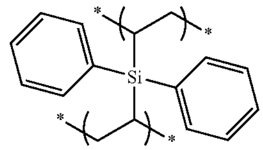

the structural unit B has a structure represented by Formula (10), the number of the structure represented by Formula (10) in the copolymer of phenylvinylsilane and alkenyl compound is L1;

Formula (10)

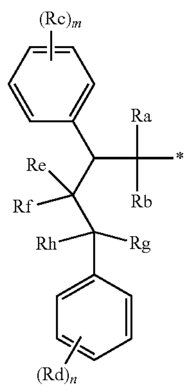

wherein the symbol "*" represents a bonding site, each of J1, J2, J3, K1 and K2 is independently 0 or a positive integer but not all 0, L1 is a positive integer; and $10 \le J1+J2+J3+L1 \le 268$, or $8 \le K1+K2+L1 \le 212$, or $8 \le J1+J2+J3+K1+K2+L1 \le 268$.

6. The resin composition of claim 1, wherein the alkenyl compound has at least one of structures represented by Formula (11), Formula (12) and Formula (13):

Formula (11)

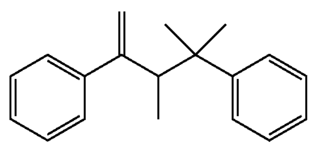

Formula (12)

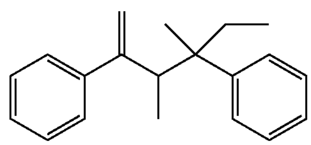

Formula (13)

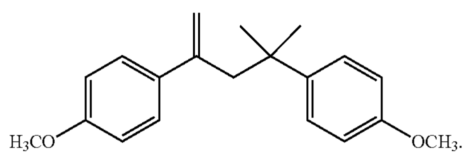

7. The resin composition of claim 1, wherein the resin composition further comprises 5 parts by weight to 30 parts by weight of a polyolefin resin.

8. The resin composition of claim 1, wherein the resin composition further comprises at least one of a vinyl group-containing polyphenylene ether resin, a maleimide resin, a maleimide triazine resin, a small molecule vinyl group-containing resin, a prepolymer of a small molecule vinyl group-containing resin, a styrene-maleic anhydride resin, an epoxy resin, a phenolic resin, a benzoxazine resin, a cyanate ester resin, a polyester resin, a polyamide resin and a polyimide resin.

9. The resin composition of claim 1, wherein the resin composition further comprises at least one of an amine curing agent, a flame retardant, an inorganic filler, a curing accelerator, a polymerization inhibitor, a coloring agent, a solvent, a toughening agent and a silane coupling agent.

10. A product, wherein the product is made from the resin composition of claim 1, and the product comprises a prepreg, a resin film, a laminate, a printed circuit board or a cured insulator.

11. The product of claim 10, wherein the product has a glass transition temperature as measured by reference to IPC-TM-650 2.4.24.4 of greater than or equal to 220° C.

12. The product of claim 10, wherein the product has a glass transition temperature as measured by reference to IPC-TM-650 2.4.24.5 of greater than or equal to 200° C.

13. The product of claim 10, wherein the product has a copper foil peeling strength as measured by reference to IPC-TM-650 2.4.8 of greater than or equal to 2.00 lb/in.

14. The product of claim 10, wherein the product has a Z-axis ratio of thermal expansion as measured by reference to IPC-TM-650 2.4.24.5 of less than or equal to 1.40%.

15. The product of claim 10, wherein the product has an X-axis coefficient of thermal expansion as measured by reference to IPC-TM-650 2.4.24.5 of less than or equal to 11.0 ppm/° C.

16. The product of claim 10, wherein the product has a dielectric constant at 10 Hz as measured by reference to JIS C2565 of less than or equal to 3.40.

17. The product of claim 10, wherein the product has a dissipation factor at 10 GHz as measured by reference to JIS C2565 of less than or equal to 0.00300.

* * * * *